United States Patent
Seurin et al.

(10) Patent No.: US 8,929,407 B2
(45) Date of Patent: Jan. 6, 2015

(54) VCSEL PUMPED FIBER OPTIC GAIN SYSTEMS

(71) Applicant: Princeton Optronics Inc., Mercerville, NJ (US)

(72) Inventors: Jean-Francois Seurin, Princeton Junction, NJ (US); Qing Wang, Plainsboro, NJ (US); Laurence Watkins, Pennington, NJ (US); Chuni Lal Ghosh, West Windsor, NJ (US)

(*) Notice: Subject to any disclaimer, the term of this patent is extended or adjusted under 35 U.S.C. 154(b) by 0 days.

(21) Appl. No.: 14/341,239

(22) Filed: Jul. 25, 2014

(65) Prior Publication Data

US 2014/0333995 A1 Nov. 13, 2014

Related U.S. Application Data

(62) Division of application No. 13/783,172, filed on Mar. 1, 2013, now Pat. No. 8,824,519.

(51) Int. Cl.
| | | |
|---|---|---|
| *H01S 3/30* | (2006.01) | |
| *H01S 5/00* | (2006.01) | |
| *H01S 3/117* | (2006.01) | |
| *H01S 5/50* | (2006.01) | |
| *H01S 5/183* | (2006.01) | |
| *H01S 3/067* | (2006.01) | |
| *H01S 3/10* | (2006.01) | |
| *H01S 3/106* | (2006.01) | |
| *H01S 3/091* | (2006.01) | |

(52) U.S. Cl.
CPC . *H01S 5/50* (2013.01); *H01S 5/183* (2013.01); *H01S 3/06754* (2013.01); *H01S 3/10* (2013.01); *H01S 3/1068* (2013.01); *H01S 3/091* (2013.01)
USPC .............................. 372/6; 372/13; 372/50.124

(58) Field of Classification Search
CPC ....... H01S 3/06754; H01S 3/091; H01S 3/10; H01S 3/1068
USPC .......................................... 372/6, 13, 50.124
See application file for complete search history.

*Primary Examiner* — Armando Rodriguez
(74) *Attorney, Agent, or Firm* — Sonali Banerjee

(57) ABSTRACT

Optical pump modules comprising VCSEL and VCSEL array devices provide high optical power for configuring fiber optic gain systems such as fiber laser and fiber amplifier particularly suited for high power operation. Pump modules may be constructed using two reflector or three reflector VCSEL devices optionally integrated with microlens arrays and other optical components, to couple high power pump beams to an optical fiber output port, particularly suited to couple light to an inner cladding of a double-clad fiber suitable for a high power gain element. Multiple-pumps may be combined to increase pump power in a modular fashion without significant distortion to signal, particularly for short pulse operation. The pump modules may be operated in CW, QCW and pulse modes to configure fiber lasers and amplifiers using single end, dual end, and regenerative optical pumping modes.

17 Claims, 16 Drawing Sheets

VCSEL PUMPED FIBER OPTIC GAIN SYSTEMS

CROSS REFERENCE TO RELATED APPLICATIONS

This application is a 'Divisional' of the U.S. patent application Ser. No. 13/783,172 filed on Mar. 1, 2013, by Seurin et al., the contents of which is being 'incorporated by reference' in its entirety.

BACKGROUND OF THE INVENTION

1. Field of Invention

The present invention relates to fiber optic gain systems and in particular to fiber optic lasers and amplifiers including Vertical Cavity Surface Emitting Laser (VCSEL) optical pumps.

2. Background Art

Fiber optic lasers and amplifiers (hereinafter referred as fiber lasers and fiber amplifiers, respectively) are well known in the art for their excellent conversion efficiency, beam quality, small volume, light weight, and low cost. Primarily, fiber lasers and fiber amplifiers have an optical gain medium, typically comprising an optical fiber doped with optically active ions in a core region surrounded by a cladding region. For example, the core may be doped with selective rare-earth ions which upon absorbing optical power from an intense light source such as a high power optical pump, are excited to a higher energy state and when the excited ions return to their ground state they provide optical gain or amplification. The light generated in the doped fiber is reflected back into the cavity for resonant amplification.

Primary application of low power lasers and amplifiers for example, in 10-100 mW (milli-Watt) range is for amplifying optical signals in telecommunications. For other industrial and military applications of lasers that are very diverse, for example, cutting, welding, marking, etc. high output power is required. The output can be multimode or single mode and results in very high power densities in a focused beam. In addition the fiber laser or amplifier output may be generated to operate in continuous mode or pulsed with various pulse widths and repetition rates. In a recent non-patent literature publication entitled "110 W Fiber Laser", presented in a Conference on Laser and Electro Optics (paper CPD11-1, at CLEO '99, 23-28 May 1999, Baltimore, Md.), Dominic et al., described a high power fiber optic laser using an Yb (Ytterbium) doped double-clad optical fiber specially designed to have a rectangular cross section cladding and a single mode core. In the configuration described therein, the double-clad fiber is pumped at both ends by polarization combining two laser diode bar packages, each package having an output power of 45 W, to achieve a total 180 W of optical pump power.

Most prior art fiber lasers and amplifiers focused on optimizing the fiber design and in particular, design of the fiber core, so as to couple pump radiation optimally. Advancements in core region designs made significant improvement in coupling pump light using different types of high power optical sources including edge emitting laser diode bars, Raman pumps, Erbium Doped Fiber Amplifier (EDFA) pumps and Vertical Cavity Surface Emitting Laser (VCSEL) particularly single VCSEL or a linear array of VCSEL, etc. Significant progress in attaining high power in fiber lasers and amplifiers may be attributed to advancements in new types of optical fibers particularly, a double-clad optical fiber. In a double-clad fiber, an inner cladding is used as a pump cavity, whereas the outer cavity prevents the pump radiation from leaking out. More specifically, pump radiation is coupled into the inner cladding and as it propagates down the fiber it propagates in and out of the core region but stays confined within the inner cladding at its boundary with the outer cladding.

In several prior art fiber lasers, inner cladding having in different shapes are constructed for optimally coupling the pump radiation to the core region. For example, in the U.S. Pat. No. 4,815,079 issued to Snitzer et al. on Mar. 21, 1989, a fiber laser and amplifier is constructed from a double clad fiber having a single mode core placed off-centered with respect to a multi-mode inner cladding and an outer cladding. The pump radiation is launched in the inner cladding layer. In addition, the fiber is configured to be slightly bent such that modes that would not ordinarily couple with the single mode core would couple pump power to the core to ensure efficient coupling of the pump power.

A different configuration for efficient coupling of pump power to a double-clad fiber is described in the U.S. Pat. Nos. 5,949,941, and 5,966,491 both issued to DiGiovanni on Sep. 7, 1999 and Oct. 12, 1999, respectively. In this design, an inner cladding region includes a stress inducing region around the core which is asymmetric, followed by a second cladding layer. The stress inducing region is for generating refractive index modulation to increase the pump radiation mode diversity to increase pump radiation propagation through the core region. A similar design is also described in another U.S. Pat. No. 6,477,307 issued to Tankala et al. on Nov. 5, 2002 having a inner cladding region with multiple sections that are designed to increase the amount of propagation of the pump radiation in the core region.

Output power in a fiber laser or amplifier is determined by input power from the pump source(s) as well as the proportion of the wavelength band which aligns with the absorption band linewidth of the active ions in the core region. In U.S. Pat. No. 7,593,435 issued to Gapontsev et al. on Sep. 9, 2009, a fiber laser capable of delivering 20 kW output power in a single mode beam is described. However this is a very complex arrangement where multiple single mode Er doped fiber amplifiers using Raman pumps, are used as pump source. The multiple fiber amplifiers are combined in single mode to multimode fiber combiners to generate a high power pump source. The narrow wavelength band closer to the emission wavelength, aligns accurately with the doped core fiber absorption line resulting in very efficient optical pumping due to high power, narrow linewidth and low photon defect.

As an alternative, edge emitting semiconductor lasers, a linear array of plurality of such lasers (or a laser bar), and extended emitter laser diodes (or arrays) emitting at wavelengths corresponding to absorption wavelength of doped ions in the fiber core are conventionally used as pump sources. One such pump configuration is described in U.S. Pat. No. 4,829,529 issued to Kafka on May 9, 1989. More specifically, a single mode fiber is embedded in a multi-mode cladding and an outer cladding layer to form a pump cavity such that the light from the pump source is confined within the pump cavity, by total internal reflection. The pump radiation to the core is coupled along the length of the fiber.

Another variation of pumping an inner cladding layer is described in the U.S. Pat. No. 6,801,550 issued to Snell et al. on Oct. 5, 2004. In this device a cladding layer in a double cladding fiber includes V-grooves to couple pump radiation efficiently to the core using multiple emitters placed along the length of the doped fiber. However, one disadvantage of this configuration is that the V-groove is designed integral to the cladding layer and works well for a specific pump wavelength.

While pumps using edge emitter lasers are useful for pumping doped core of fiber lasers and amplifiers, edge emitter lasers have a relatively broad linewidth and all the light emitted by the pump laser does not contribute towards exciting the doping ions which absorb only in a narrow wavelength band. Furthermore, edge emitter laser wavelength varies considerably with operating temperature resulting in misalignment in the pump wavelength and the absorption lines of the doping ions. Therefore, each edge emitting laser in a bar requires a temperature controller mechanism to stabilize respective operational wavelength.

In recent years, optical pumps for solid state lasers have been configured using VCSEL devices. VCSELs have very narrow linewidth and in addition their wavelength varies much less with temperature and drive current. The VCSEL chip can be configured with arrays of VCSEL devices in two dimensions which results in very high output power from a single array. In the U.S. Pat. No. 6,888,871 issued to Zhang et al. on May 3, 2005, an optical pump using VCSEL array is described for pumping a solid state laser. VCSELs and arrays of VCSELs are very compact and may be easily integrated with other devices for providing additional optical and control functions to the pump.

In other prior art patent publication, for example, in the U.S. Pat. No. 7,295,375 issued to Jacobowitz et al. on Nov. 13, 2007, VCSEL arrays in combination with micro lenses and optical interconnects are described. A compact packaging for VCSEL arrays to a fiber cable is described in the U.S. Pat. No. 6,984,076 issued to Walker Jr. et al. on Jan. 10, 2006. However, each individual VCSEL is wire bonded to a contact pad and to the external connectors of the packaging. One major disadvantage of this approach is that for high optical power application, the wire bonding is prone to failure, thereby imposing a practical limitation on output power that can be obtained from such pumps.

SUMMARY OF THE INVENTION

In this invention, an optical pump comprising a high output power optical module including a VCSEL or a VCSEL array device coupled to an optical fiber particularly suited to configure high power fiber optic gain systems is provided. The optical module may be configured using different combinations of VCSEL arrays and optical components for application requiring high power output.

One important aspect of the high output power module provided in this invention is a three reflector VCSEL device for better wavelength stability of the pump modules in high power fiber gain systems such as, a fiber laser and an amplifier. The optical module together with fiber components are configured to provide a fiber laser and an amplifier. Multi-stage fiber optic systems for example, fiber laser, single or multi-stage amplifiers and other combinations thereof may be configured in a modular fashion for extending the power output requirements for different applications.

In one embodiment of the invention a high power optical pump is provided. The high power optical pump comprises one or more VCSEL or VCSEL arrays. In one variation of the invention VCSELs or VCSEL arrays are packaged with one or more optical components for beam shaping and focusing. The output of the VCSEL or VCSEL array is coupled to a fiber pigtail using a micro-lens array, a single lens or a combination thereof. In another embodiment of the invention, selection of one or more VCSELs or VCSEL array(s) and the array(s) dimension is determined by required output power. Advantageously, the optical module may be constructed from conventional two reflector VCSEL devices or from high power three-reflector VCSEL devices constructed according to this invention.

In another embodiment, a fiber laser is provided by coupling light from a high power optical pump module comprising one or more VCSELs or VCSEL arrays. In practice, light from the pump module is coupled to a doped silica fiber gain medium. The doped fiber gain medium may comprise a double-clad silica fiber where pump radiation is confined within an inner cladding layer. The gain medium is placed between two reflectors, one reflector preferably having reflectivity smaller than the other, to direct the output laser light. The light from the VCSEL pump module may be coupled directly to the gain medium using a focusing lens, tapered optics, or via optical components such as a combiner, a circulator, etc.

In a variant configuration, the doped silica fiber gain medium is pumped from both ends by providing separate optical pump modules at the two ends of the gain medium. Additional optical components such as an acousto-optic switch may be provided in some applications. The fiber laser may be operated in continuous wave (CW) mode, quasi continuous wave (QCW) mode or pulse (P) mode. Furthermore, fiber laser may be operated for short pulses by operating the pump module using a current source operated in pulse mode. The pulse width of the laser may further be reduced by operating the laser cavity in Q-switching mode.

In yet another embodiment a fiber amplifier is provided by coupling light from a high power optical pump module comprising one or more VCSELs or VCSEL arrays. Light from the pump module is combined with the signal to be amplified in the core of a doped silica fiber gain medium, having a single-clad or, preferably a double-clad silica fiber where pump radiation is confined within an inner cladding layer. The signal and pump are coupled using a conventional combining device such as, an optical combiner, a multiplexer or a polarization combiner, etc. or a combining device specially designed to operate with double-clad fiber. The amplifier so configured may be operated to amplify any optical signal including a short pulse (seed pulse). In one embodiment a short pulse regenerative amplifier is provided. A multi-stage fiber amplifier may be configured by modularly connecting several amplifiers for enhancing output power.

In a different embodiment, a fiber laser may be cascaded with a fiber amplifier in order to boost laser output power. The combination may provide a desirable level of laser power without increasing the pump input power to operate the fiber laser. In an alternative configuration of fiber laser and amplifier, output from several pump modules may be combined to enhance input optical pump power to a doped fiber gain medium in order to obtain higher output power. In yet another embodiment, pump modules may be applied to a gain medium from one end or from both ends.

BRIEF DESCRIPTION OF THE DRAWINGS

A broad framework of the invention is described using different embodiments described in the specification which will be better understood in conjunction with the drawing figures in which.

DETAILED DESCRIPTION

A broad framework of the principles will be presented by describing various aspects of this invention in exemplary embodiments shown in different drawing figures. For clarity and ease of description, each embodiment includes only a few aspects. However, different aspects from different embodiments may be combined or used separately, to put the invention to practice. Many different combinations and sub-combinations of the representative embodiments within the broad framework of this invention, that may be apparent to those skilled in the art but not explicitly shown or described, should not be construed as precluded.

Figure 1:
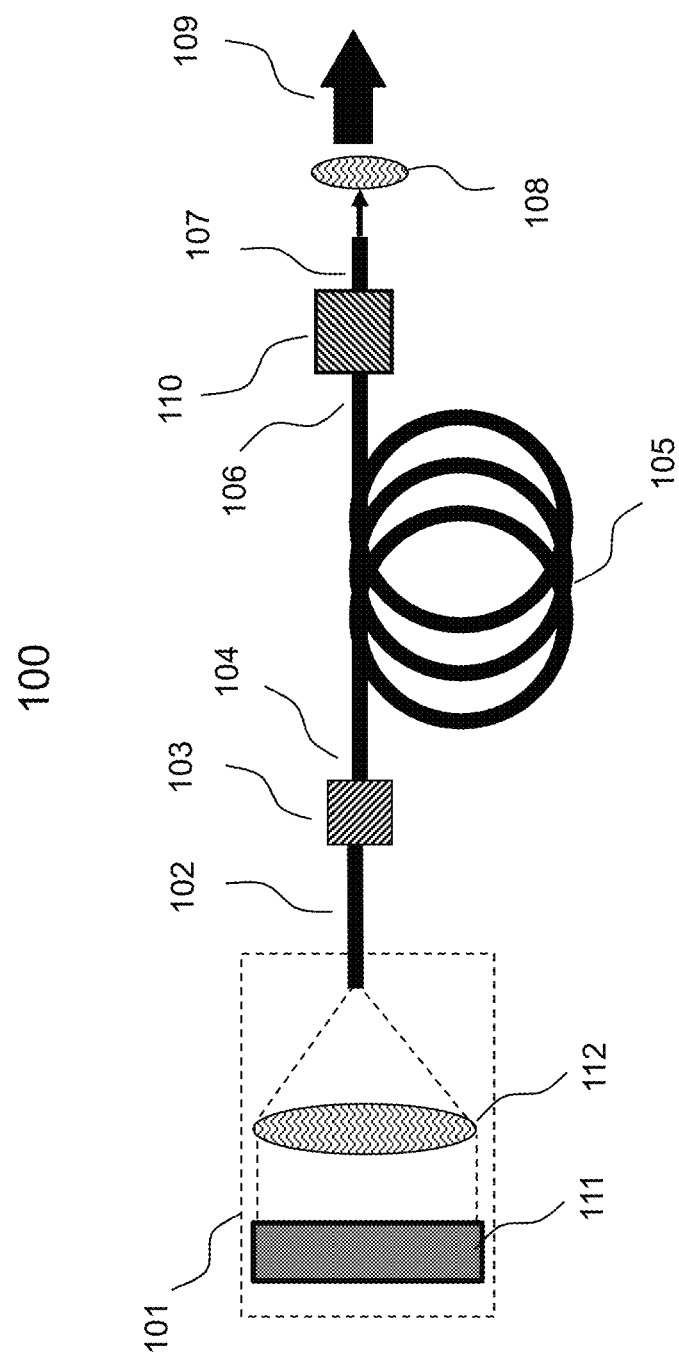
FIG. 1 shows a schematic representation of a basic fiber gain system suitable to practice the invention.

FIG. 1 shows an exemplary fiber optic gain system 100 to explain different aspects of the invention that may be configured to practice the invention in different modes. The fiber optic system is represented in terms of basic building blocks to illustrate the broad principles and should not be construed as limiting. Details of each block will be elaborated later. More specifically, the fiber optic gain system comprises an optical pump module 101 including an output fiber 102 (also referred synonymously as a fiber pigtail). The pump module further includes an optical emitter 111 and a focusing device 112 to focus the light from the emitter to the fiber pigtail 102. The pump module will be described later in detail. Optical output from the pigtail 102 of the pump module is spliced, preferably by fusion splicing, to a fiber pigtail 104 of a gain element section 105. In an alternative arrangement, a low-loss connector 103 may also be used for light coupling from the pump module to the gain element section.

The gain element 105 forms the active part of the gain system. The gain element is a fiber section where the core is doped with active ions that include but are not limited to, Ytterbium, Erbium, Neodymium, Thulium, Praseodymium, etc. and are well known dopants for fiber gain elements. The gain element may include a single-clad fiber including only one layer of cladding, or preferably a double-clad fiber including an inner cladding to couple the pump radiation and an outer cladding to confine the pump radiation to the core and inner cladding of the fiber. It is important to note that the pump module pigtail may also be a double clad fiber that is matched to the gain element fiber pigtail to minimize coupling losses. In some instances, a small piece of input fiber is used, such that one end matches the gain element and the other end matches the pump module pigtails, respectively. These and other technical aspects for achieving low loss coupling are well known in the art and will not be described in more detail.

The pump radiation excites the active ions in the core to a higher electronic state for lasing or amplification action. The output end 106 of the gain element is connected to an output fiber 107 preferably by a fusion splice or a low-loss connector similar to 103 shown at the input end. The output of the gain element may generate a single mode or a multi-mode diverging beam which is collimated into an output beam 109, using collimating optics 108 which may include but is not limited to, a single lens, a combination of lenses, or a combination of lenses and light guiding optics, etc. For better stabilization of the output beam, an isolator 110 may optionally be included after the gain section to reduce the reflected light from the object(s) illuminated by the output beam. Additional optical elements such as, reflectors, gratings, couplers, circulators, acousto-optic switches, etc. may be appropriately positioned on either side of the fiber gain section to configure the gain element to be operated as a laser or an amplifier, and will be described in more detail later.

Figure 2:
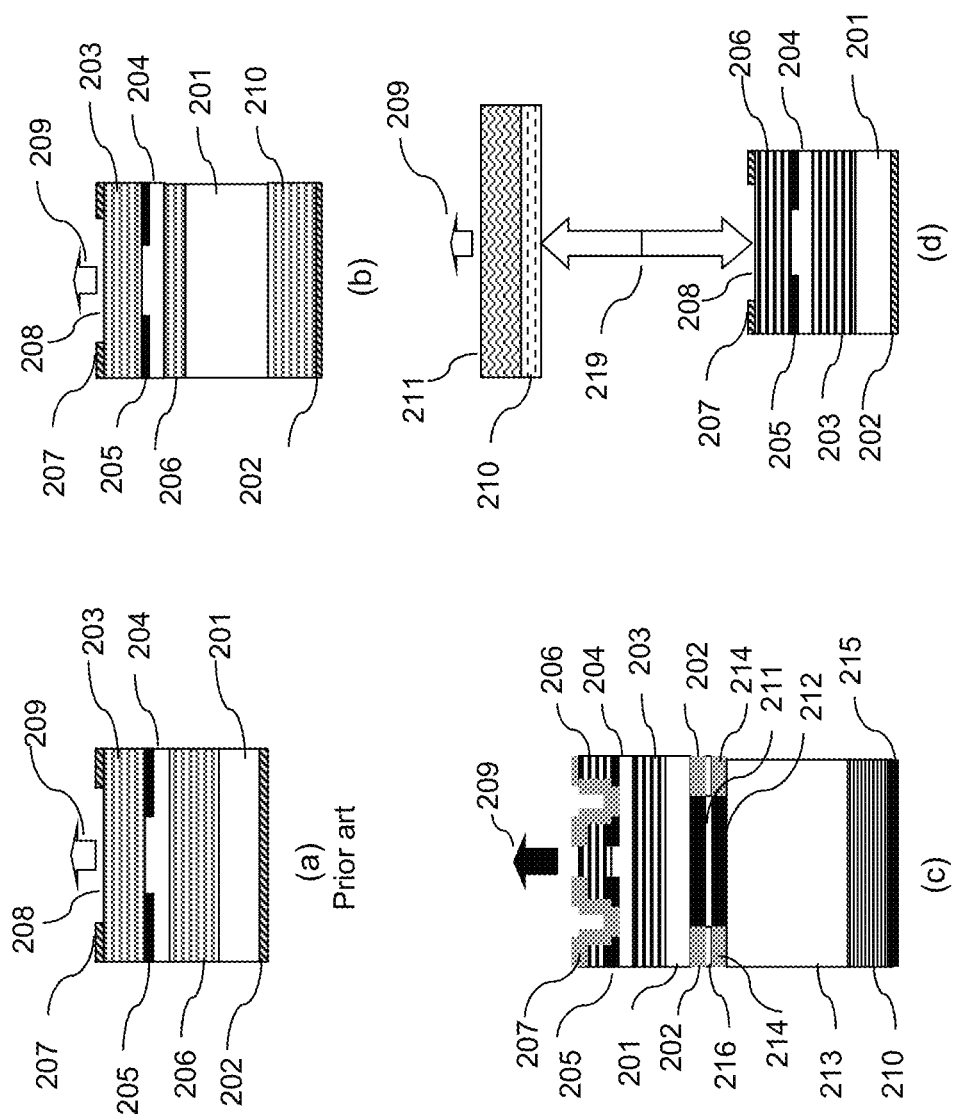
FIG. 2 shows schematic representations of different types of top emitting VCSEL devices, a two reflector VCSEL device (2a), and extended cavity VCSEL device including, an integrated third reflector (2b), third reflector externally bonded to the device (2c), and external third reflector (2d), respectively.

Optical Pump Module:

In one aspect, the invention provides a high power optical pump module comprising single high output power VCSEL devices or multiple VCSEL devices arranged in two-dimensional arrays. Optical illuminators constructed by arrays of VCSEL have been disclosed in a U.S. patent application Ser. No. 13/541,906, filed on Jul. 5, 2012, that issued as the U.S. Pat. No. 8,675,706 to Seurin et al. on Mar. 18, 2014, and assigned to Assignee of this application. Contents of that application co-authored by some of the inventors of this application and co-owned by Princeton Optronics Inc., Mercerville, N.J., is being incorporated by reference in its entirety. The VCSEL devices disclosed in the above referenced application are conventional VCSEL devices configured using two-reflectors placed on either side of an active layer. In FIG. 2, several VCSEL device structures including, a conventional device are shown. Identical elements having similar functions in the devices shown in FIG. 2 are labeled with same reference numerals and the same description applies.

More specifically, a two reflector self lasing VCSEL devices shown in FIG. 2a, is constructed on a substrate 201 including a first electrical contact layer 202 (also a first electrical terminal). A light emitting region 204 which is a semiconductor gain medium is disposed between two reflectors 203 and 206. The reflectors can be of various types such as distributed Bragg gratings, including dielectric or semiconductor, gratings including semiconductor, dielectric or metal, or reflecting metal. A second electrical contact layer 207 (also a second terminal) is formed on a surface opposite to that of the substrate contact 202. A current confinement aperture 205 controls the flow of drive current to the light emitting region and also determines the shape of emission beam, as has been described in the co-authored and co-owned pending U.S. patent application Ser. No. 13/337,098 by Seurin et al., filed on Dec. 24, 2011. A transparent window 208 aligned with the current confinement aperture is provided on the VCSEL surface for the laser output 209 to be emitted in a vertical direction (with respect to the plane of the substrate in this illustration).

The conventions adopted here only for the purpose of illustration and ease of description, should not construed to be limiting. For the purpose of discussion following convention would be adopted—reference to a 'top' and 'bottom' ends or a 'top' and 'bottom' electrical contacts of the device is in reference to an emission surface. Accordingly, the emission end and the electrical contact on the top end of a device would be referred as the top end and the top contact, respectively. The non-emission end of the device and the electrical contact to the non-emission end would be referred as the bottom end and the bottom contact, respectively in the exemplary embodiments throughout, unless stated otherwise. Accordingly, the top emission device shown in FIG. 2a has the emission surface 208 located opposite to the substrate end and the VCSEL emission 209 is from a window above the light emitting region 204.

A prior art device shown in FIG. 2a may be used to construct a pump module particularly for low power applications for example, to pump a solid state lasers as has been disclosed in the U.S. patent application Ser. No. 13/541,906, filed on Jul. 5, 2012, that issued as the U.S. Pat. No. 8,675,706 to Seurin et al. on Mar. 18, 2014, and assigned to Assignee of this application. A high power pump module constructed using plurality of conventional two reflector device arranged in arrays may be constructed to optically pump fiber gain systems in some applications, and will be described shortly. However, better pump modules having far more desirable output characteristics including but not limited to, higher output power in a single mode, better wavelength stability (with temperature over longer time operation), etc., have been developed using extended cavity VCSELs constructed according to this invention. Exemplary extended cavity VCSEL shown in FIGS. 2b-2d devices have a basic structure very similar to the prior art device shown in FIG. 2a except that it includes an additional third reflector to achieve some of the desirable characteristics mentioned earlier.

More specifically, FIG. 2b shows a top emitting VCSEL device having three reflectors. The device constructed on a substrate 201 has a light emitting region 204 disposed between a first reflector 203 and a second reflector 206. The reflector 206 in this device is made to be partially reflecting and a third reflector 210 is fabricated on the bottom surface of the substrate opposite to the surface with the light emitting region. The reflectors 206 and 210 when designed with specific phase relationship, results in high reflectivity such that the combination, together with the reflector 203 provides desired lasing operation. Electrical contact to the substrate is made through the third reflector 210. Similar to the prior art device shown in FIG. 2a, the output 209 is still transmitted out of the reflector 203 in this exemplary configuration.

In a variant exemplary embodiment of an extended cavity VCSEL device shown in FIG. 2c, a top emitting VCSEL device is constructed on a substrate 201 has a light emitting region 204 disposed between reflectors 203 and 206, respectively. Unlike the device described in reference with FIG. 2a, the reflector 203 in this embodiment forms the middle reflector and is made partially reflective to include a third reflector 210 to configure an extended cavity device. The substrate 201 has a selective antireflection coating 211 applied to the surface opposite to the light emitting region 204. More specifically, the antireflection coating is applied in regions where the optical beam traverses between the reflectors 203 and 210. A metallized contact 202 is formed at the bottom in the regions not covered with the antireflection coating.

An extended cavity is formed between the reflector 206 and the third reflector 210 which is deposited on a transparent substrate 213 and has an antireflection coating 212 applied to one surface while the opposite surface is coated with a metal layer 215 to facilitate bonding to a heat sink. The surface of the transparent substrate including the antireflection coating has metallization 214 applied to the areas outside the region where the optical beam traverses. The third reflector 210 is located below the bottom surface of the VCSEL device at a design distance, determined by the thicknesses of the VCSEL and transparent substrates 201 and 213, such that the combined phase matched reflection from the reflectors 203 and 210 provide a high reflectivity to produce laser action having the desired output characteristics including, high output power in single mode, better wavelength stability and uniform beam shape. The third reflector on the transparent substrate is attached to the substrate 201 at the surface having the antireflection coating 211, using a solder 216 to form a monolithic module. The resonant laser action occurs in the cavity formed by the three reflectors 210, 203 and 206. The laser output light 209 emits from the reflector 206.

In a different embodiment of the invention an extended cavity VCSEL may also be configured using an external reflector as shown in FIG. 2d. In this embodiment the basic device is very similar to a prior art device shown in FIG. 2a. More specifically, the VCSEL device comprises a substrate 201 on which a light emitting region 204 is disposed between two reflectors 203 and 206, respectively. Reflectivity of the reflector 206 is substantially reduced such that an external third reflector 210 having a pre-determined reflectivity is positioned at a pre-determined height above the reflector 206. In particular, the third reflector is placed above the VCSEL emission window 208 such that the combined phase matched reflectivity of the reflectors 206 and 210 is high enough to provide laser output 219 in the cavity formed by reflectors 203, 206 and 210. The output 209 of the laser is emitted from the third reflector from a surface 211 that is opposite to the surface facing the VCSEL device.

Figure 3:
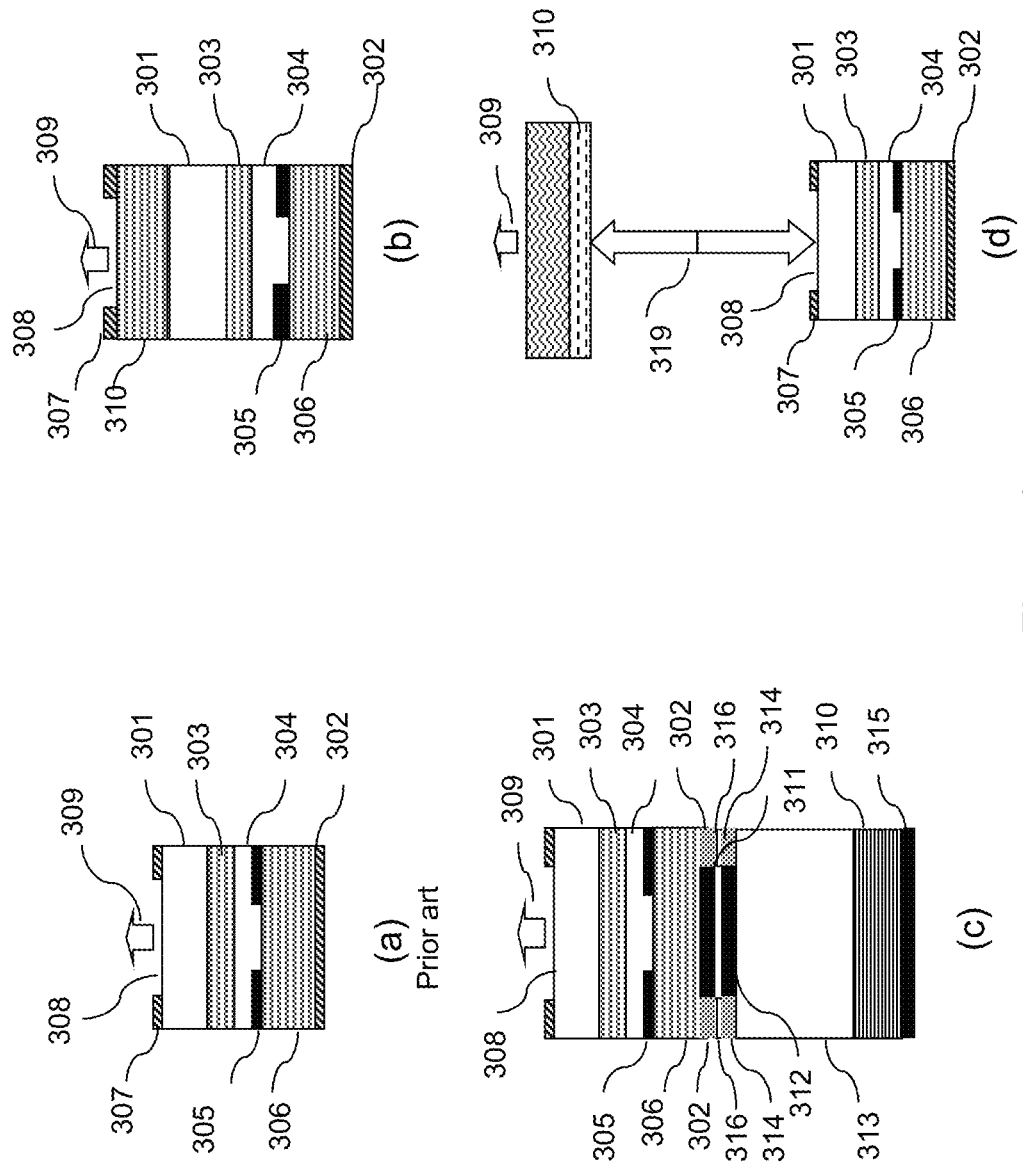
FIG. 3 shows schematic representations of different types of bottom emitting VCSEL devices, a two reflector VCSEL device (3a), and extended cavity VCSEL device including, an integrated third reflector (3b), third reflector externally bonded to the device (3c), and external third reflector (3d), respectively.

In the devices shown in FIGS. 2a-2d, reference is made to a top-emitting configuration where laser emission takes place from the surface of the devices opposite to the substrate end. Alternatively, an extended cavity VCSEL may also be configured for a bottom emitting device, shown in FIGS. 3a-3d. In FIGS. 3a-3d elements that are equivalent and provide same functionality in corresponding top-emitting counter-part devices shown in FIGS. 2a-2d, are labeled with similar reference numerals and their description will not be repeated. Referring now to FIG. 3, a conventional prior art two terminal bottom emitting device is shown in FIG. 3a and described in the U.S. patent application Ser. No. 13/541,906, filed on Jul. 5, 2012, that issued as the U.S. Pat. No. 8,675,706 to Seurin et al. on Mar. 18, 2014, and assigned to Assignee of this application. Contents of the above mentioned application is being incorporated by reference in its entirety.

In a bottom emitting device, the emission surface is located on the substrate side of the device. Accordingly, the top and bottom contacts are located on the substrate end and at the active layer end, respectively. It should be noted that the bottom emitting device is typically mounted with the substrate side up, such that the light emission in the device is still in an upward direction (with respect to the plane of the substrate in this illustration).

Basic principle of an extended cavity bottom emitting device is similar to the top-emitting counterpart shown in FIGS. 2b-2d. To configure an extended cavity 'bottom emitting' VCSEL device shown in FIGS. 3b-3d, the reflector 303 is made with a lower reflectivity and placed between the reflector 306 and the third reflector 310, respectively. Reflectivity and position of the third reflector with respect to the reflector 303 is determined such that the phase matched reflectivity from the combination of reflectors 306, 303 and 310 provides lasing in the VCSEL cavity. More specifically, in the embodiment shown in FIG. 3b, the third reflector 310 is integrated with the substrate 301. In the alternative embodiment shown in FIG. 3c, the third reflector 310 is constructed on a transparent substrate 313 and the transparent substrate is bonded to the bottom emitting VCSEL device substantially in a manner described in reference with FIG. 2c to construct a monolithic combination. That description will not be repeated. In the embodiment shown in FIG. 3d, the third reflector 310 is placed external to the VCSEL device.

It will be apparent to those skilled in the art that in the embodiments shown in FIGS. 3b-3d, the laser emission is through a window 308 in the VCSEL substrate 301. Although devices in FIGS. 2a-2d and 3a-3d are shown with the substrate 201 and 301, respectively, it is a common practice to reduce the thickness of the substrate, or completely remove the substrate in some applications, for efficient heat dissipation. One advantage of the devices described in reference with FIGS. 2 and 3 is that the VCSEL devices have planar contacts that do not use an external wire bonding. As a result whole assembly can be constructed at the wafer level to produce a multitude of modules on the wafer and then the completed modules are separated out by dicing without having to connect individual devices externally to individual contact pads.

Figure 4:
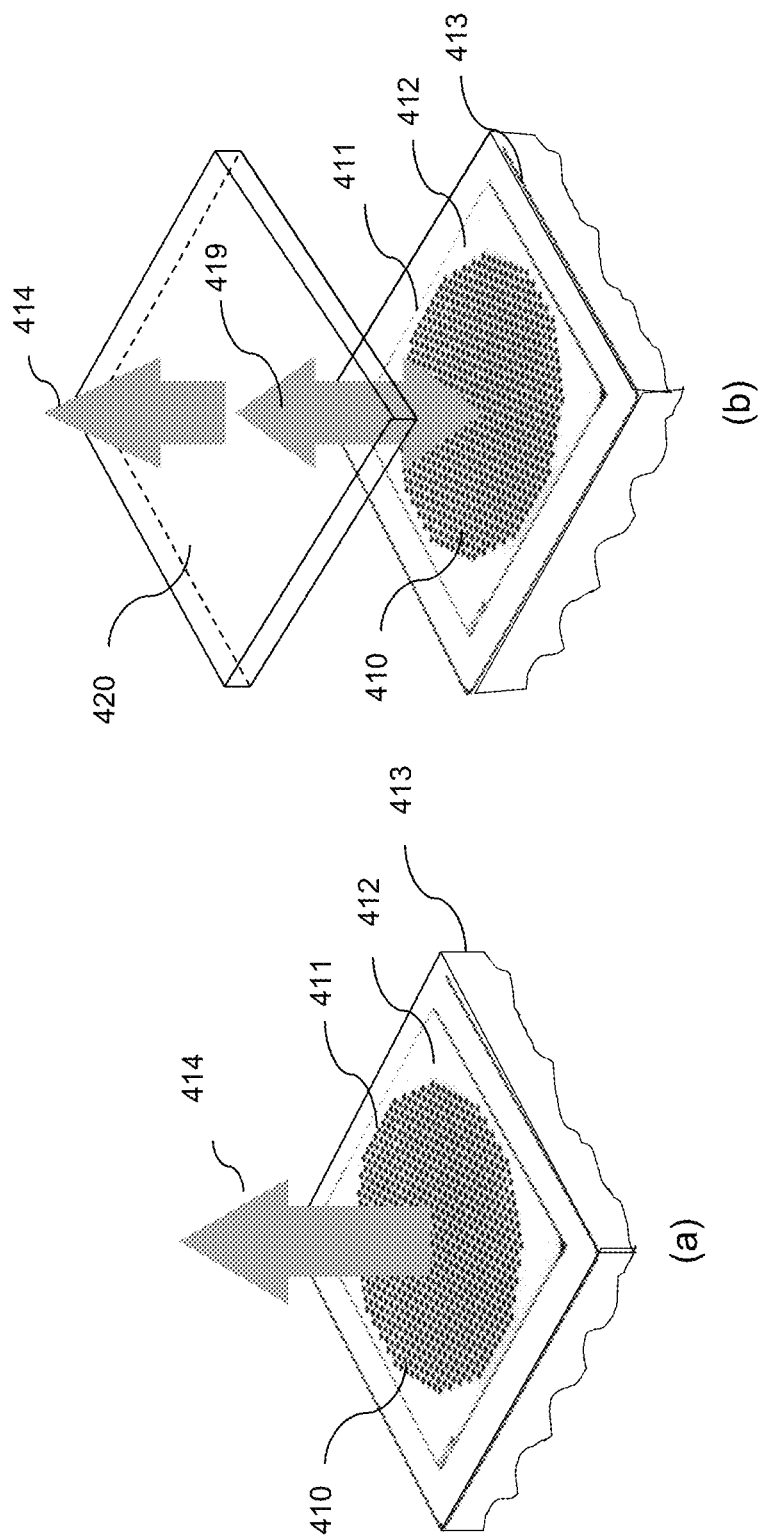
FIG. 4 is a schematic representation of two dimensional VCSEL array configurations, two reflector or extended cavity VCSELs (a) and, extended cavity VCSELs with external reflector (b)

The VCSEL devices described here may advantageously be extended to construct VCSEL arrays and arrays of VCSEL arrays, to configure optical pump modules in a modular fashion as has been described for conventional two terminal VCSEL devices in the U.S. patent application Ser. No. 13/541,906, filed on Jul. 5, 2012, that issued as the U.S. Pat. No. 8,675,706 to Seurin et al. on Mar. 18, 2014, and assigned to Assignee of this application. Accordingly, three reflector extended cavity VCSEL devices may be configured in an array as shown in FIG. 4. More specifically, FIG. 4a shows a two dimensional VCSEL array 411 constructed from a plurality of VCSEL devices (each dot 410 represents a VCSEL device) on a common substrate 412. VCSEL arrays may be constructed from any type of VCSEL device described in reference with FIGS. 2a-2c and 3a-3c.

All the VCSEL devices in the array are electrically connected to the substrate which functions as a first common terminal of the array. In order for the VCSELs to emit collectively, the second electrical contact of each VCSEL in the array is connected using a common metallization on the array surface which functions as a second common terminal of the array. One important aspect of the planar arrays constructed according to this invention is that the contacts to the array are entirely planar thereby eliminating the need for external wire bonding. Those skilled in the art will be able to appreciate that reliability of these VCSEL arrays is substantially higher than conventional devices having external wire bonding.

For higher output power, all the VCSEL devices in the array are configured to emit collectively in-phase, in the same direction as shown by an upward arrow 414 in this example. For the ease of description, the VCSEL array 412 as shown will be referred as VCSEL array chip (or array chip hereinafter). In this particular example, the array of VCSEL devices is arranged in a circular pattern. It can be appreciated that array chips may be configured in any regular geometric pattern or random shape. The array chip 412 can be mounted on a thermal submount 413 that is described in the co-authored and co-owned pending U.S. patent application Ser. No. 13/337,098 by Seurin et al., filed on Dec. 24, 2011. Content of the above mentioned application is being incorporated by reference in its entirety.

Referring now to FIG. 4b, there it shows a VCSEL array configured with an external reflector. More specifically, an array of multiple VCSEL devices constructed on a common substrate is configured into a three reflector VCSEL array. A separate external reflector 420 (equivalent of the third reflector in FIGS. 2d and 3d) is located at a pre-determined distance above the top of the VCSEL array substrate 412 such that the combined cavity comprising the three reflectors produces laser action 419 in each VCSEL device with the desired characteristics. The output beam from the array of VCSELs 414 is transmitted out in the upward direction (in this particular example) from the external reflector 420.

It is noted that external cavity VCSEL array may be constructed from top or bottom emitting VCSEL devices shown in FIGS. 2a-2d or 3a-3d by appropriately reducing reflectivity in the one of the reflector (206 or 306 or 203 and 303, respectively) as the case may be. The entire module may be assembled in a wafer form and a single third reflector may be bonded to the substrate with the VCSEL array. In a variant embodiment, many modules may thus be fabricated together and diced with the external reflector as well. Those skilled in the art will be able to practice the invention in many different variant fabrication processes that are well known in the art.

As a matter of convention and not by way of limitation, in the following discussion the term VCSEL arrays or VCSEL array devices or elements will include any of the VCSEL devices including VCSELs, extended cavity VCSELs and external cavity VCSELs or array chips of VCSELs, described in reference with FIGS. 2a-2d, 3a-3d and 4a-4b. Using these VCSEL devices, optical modules may be constructed. It is known that emission from single VCSEL is narrow and may be coupled to an optical fiber with relative ease. However, to obtain high power from VCSEL module, as will be necessary to configure a high output power VCSEL pump module for a fiber gain system, additional optical elements may be necessary to facilitate beam shaping from each VCSEL in the array or of the entire array as the case may be, depending upon the application.

Figure 5:
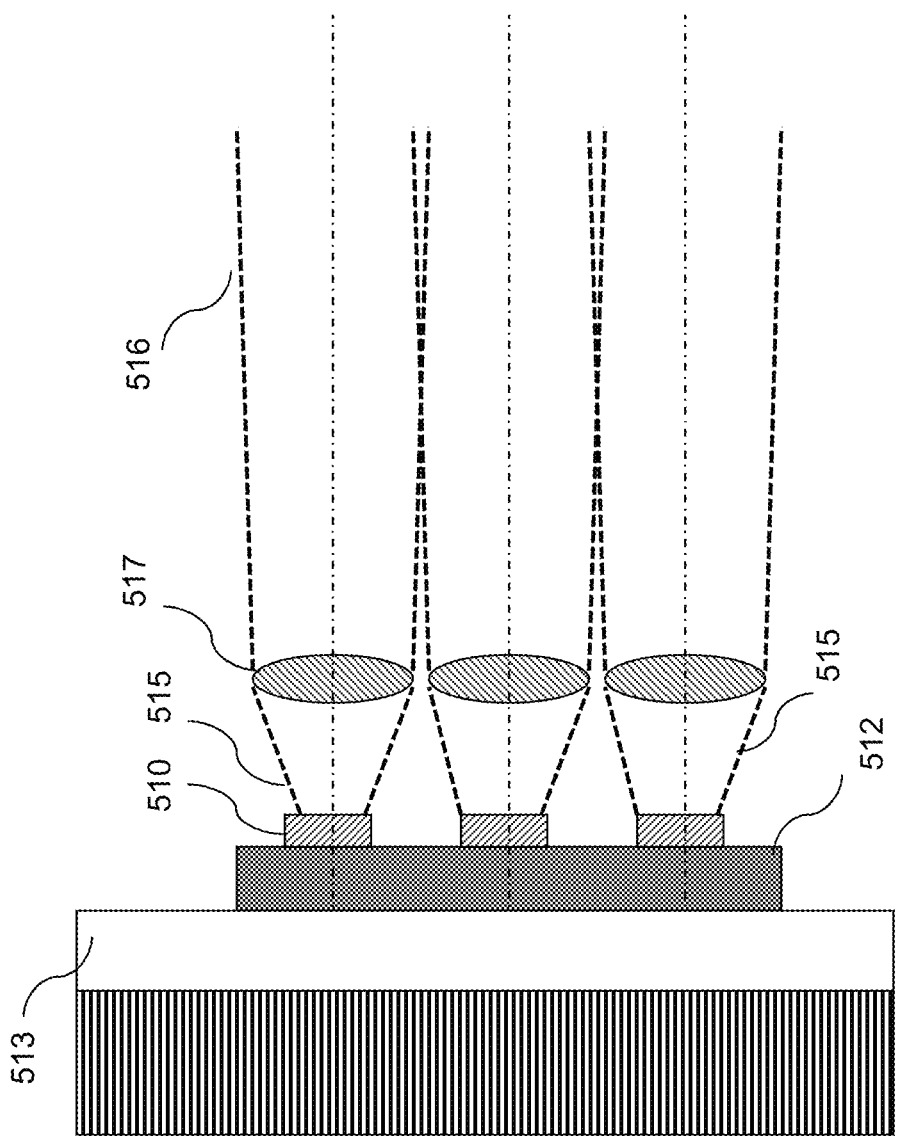
FIG. 5 is a schematic drawing showing placement of a microlens array with the VCSEL array for obtaining a uniform emission pattern collectively.

Referring now to an embodiment shown in FIG. 5, one option for beam shaping is to use an array of microlens to collimate output beams from individual VCSELs in the array device. More specifically, a VCSEL array device 510 and the microlens array lens elements 517 are designed and fabricated so that the individual devices and elements are aligned on the same axes. The VCSEL array substrate 512 is mounted on a heat sink 513 for effective cooling of VCSEL devices. The microlens array is aligned and positioned at a pre-determined distance from the VCSEL array so that the diverging beams 515 from the VCSEL elements are formed into an array of collimated beams 516 with the same array pitch and form factor as the VCSEL array and microlens array. The resulting combined output beam that appears to have a quasi-uniform intensity cross section with much lower divergence than the original output beams from the VCSEL array.

Figure 6:
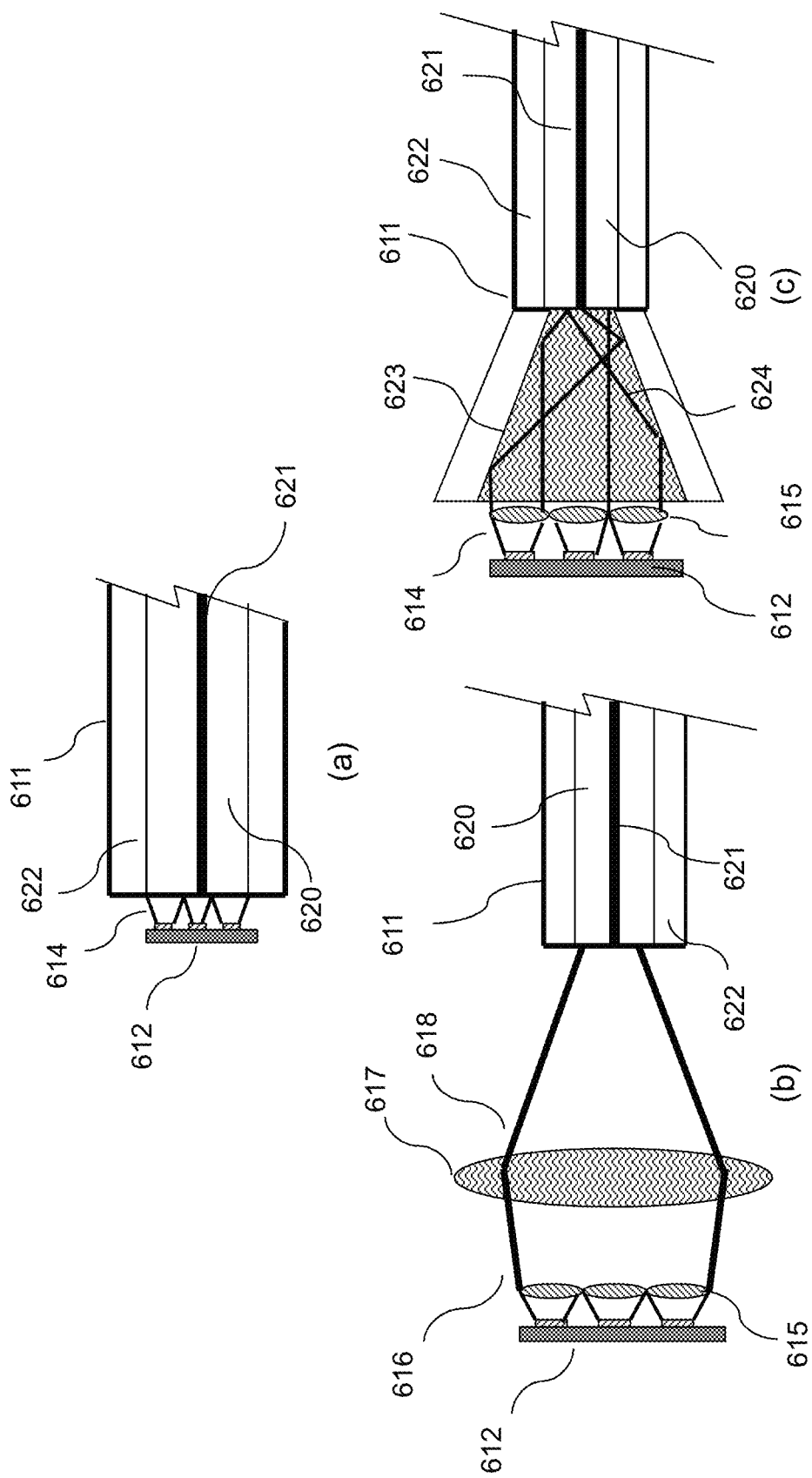
FIG. 6 depicts coupling of pump radiation to inner cladding of a fiber, direct coupling (a), lens coupling (b) and, an optical taper coupling (c), respectively.

In practice, other optical arrangements may be necessary to efficiently couple output light from VCSEL array for pumping a fiber and in particular a double-clad fiber frequently used for fiber gain systems such as a fiber laser or amplifier. A few exemplary arrangements that are particularly suited for VCSEL pump modules are shown in FIG. 6. Referring now to FIG. 6a there it shows an arrangement to directly couple light from a VCSEL array to a double-clad optical fiber. However, these arrangements may also be used for coupling pump light to a single-clad fiber. Alternatively, pump light may be coupled to a single-clad fiber which is then coupled to a double-clad fiber or a double-clad fiber gain element, preferably by fusion splicing.

More specifically, a VCSEL array 612, having a plurality of VCSEL devices collectively generate laser output light 614 in a certain area which is coupled to a double-clad fiber 611 comprising a fiber gain system. The double-clad fiber is well known in the art and typically comprises a central core region 621 surrounded by an inner cladding region 620 and an outer cladding region 622, respectively. The arrangements shown and described here are only exemplary and should not be construed to be the only options. Other methods for coupling output of a VCSEL array to single or double-clad fiber may also be used.

Refractive indices of the inner and outer cladding regions in a double-clad fiber are selected such that the pump radiation is confined between the inner and outer cladding regions to surround the core region for efficient coupling of the pump radiation to the core region. The core region 621 is typically doped with optically active ions that need to be excited by the pump laser output 614 to configure a fiber laser or a fiber amplifier (different from the VCSEL arrays that form the source for optically pumping the fiber laser). This arrangement is particular appropriate when the inner cladding diameter is smaller or about the same size as the VCSEL array emission area. The VCSEL array may or may not include a microlens array.

FIG. 6(b) shows another arrangement for coupling light from VCSEL pump laser to a fiber. In particular, pump radiation from a VCSEL array 612 including a microlens array 615, uses an external focusing lens 617 to couple the collimated output beams 616 into the inner cladding region 620 of the double-clad fiber 611 at the input of the fiber gain system (for example a fiber laser or amplifier). The light in the inner cladding is confined in this region by the lower index outer cladding 622. The input end of the double-clad fiber 611 usually does not include a core region 621 over a short distance since the fiber laser or amplifier radiation is normally confined to other regions of the fiber. However, it is not unusual to have a core region at the input end of the double-clad fiber.

In yet another arrangement shown in FIG. 6c an optical taper end is used for coupling pump laser light to a double-clad fiber depending on various circumstances that includes but are not limited to, size of the array 612 and properties of the fiber 611. More specifically, a taper optical component 623 with a high index core and lower index cladding may be used instead of a focusing lens. A collimated beam 616 from the VCSEL array pump laser 612 and corresponding microlens array 615 is coupled to the fiber through the taper section 623. The beams 624 are reflected from the tapered sides of the core region of the component into the fiber inner cladding 620. It should be noted that light from the VCSEL array may also be coupled to a taper end without the microlens array. The choice of coupling method is determined by the output power to be coupled and the application. While only few examples are being described here, many other combinations and sub-combinations of these methods may be apparent to those skilled in the art.

One aspect of this invention is to provide a high optical power pump module for pumping a fiber gain system, for example, a fiber laser or a fiber amplifier. VCSEL devices and in particular, extended and external cavity VCSEL devices described in reference with FIGS. 2 and 3 generate high power output in a single mode thereby resulting in very high quality output beam. VCSEL arrays constructed from these types of VCSEL devices are ideally suited to construct very high power optical pump module in a small foot print. Typical output optical power obtained from these modules may be in the range of 20-200 W in CW operation and 200 W-2 kW (kilo Watt) in pulsed operation. It is important to note that to obtain similar power output from conventional optical pumps known in the art it would require very elaborate cooling systems to cool optical pumps. Pump module constructed from VCSEL arrays has a unique advantage in this regard and has been disclosed in the U.S. patent application Ser. No. 13/541,906 filed on Jul. 5, 2012, that issued as the U.S. Pat. No. 8,675,706 to Seurin et al. on Mar. 18, 2014, and assigned to Assignee of this application, contents of which, is being incorporated by reference in its entirety.

Figure 7:
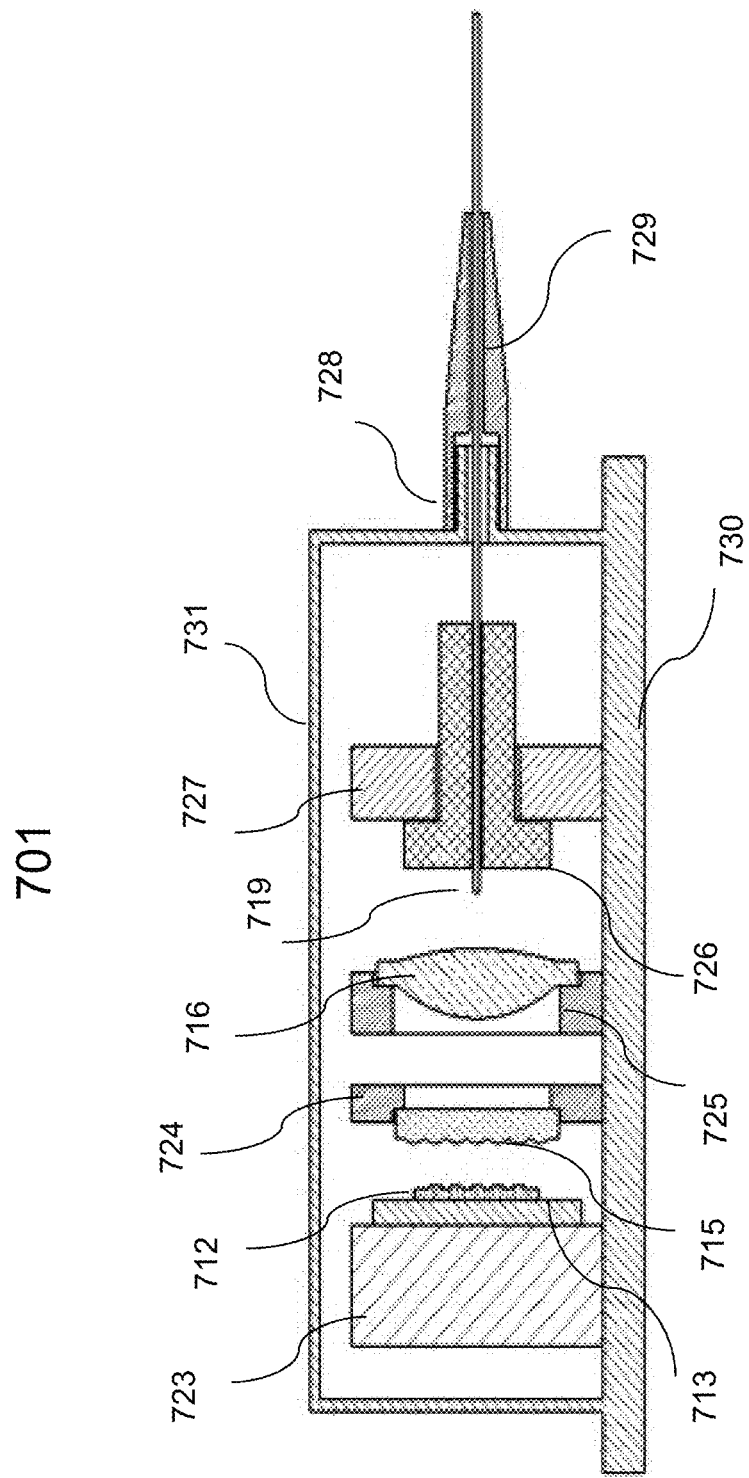
FIG. 7 depicts a VCSEL array optical pump module including an optical fiber output port.

Referring now to FIG. 7, there it shows one embodiment of an optical pump module constructed from VCSEL arrays. More specifically, an optical pump module 701 comprises a module housing having two parts; a housing baseplate 730 and a cover 731. The housing cover further includes a fiber alignment guide 728 and a bend radius limiter 729, respectively, to securely hold an optical fiber pigtail 719. It should be noted that the pump module shown here is merely exemplary and other physical shapes and dimensions may be employed depending upon the output power and heat dissipation requirement of the pump module. The pump module further includes an optical source comprising a VCSEL array 712 placed on submount 713 for example, a printed circuit high thermal conductivity ceramic or other similar platform suitable for constructing planar contacts. The submount is bonded to a high thermal conductivity base 723.

A fiber assembly mount 727 holding an alignment housing 726 is included to hold the fiber pigtail 719 to be aligned with the optical source. The fiber pigtail is fed through the alignment guide 728 and the bend radius limiter 729. And while other types of fiber pigtail may be used, a double-clad fiber pigtail is preferred in this embodiment for constructing high optical power pump module, particularly for use with a fiber laser or fiber amplifier having a gain element comprising a double-clad fiber. In order to obtain a collimated pump beam a microlens array 715 is supported on an independent mount 724. The microlens array is disposed at a pre-determined distance from the VCSEL array and the two are aligned so as to generate a collimated pump beam having a uniform intensity as has been described in reference with FIG. 5. Alternatively, the microlens array may be integrated with the VCSEL array at a wafer processing level.

In this exemplary embodiment the collimated pump radiation from the VCSEL array is coupled to the fiber pigtail using a focusing lens 716. The focusing lens is supported on a second independent mount 725. It should be noted that other coupling arrangements described earlier in reference with FIG. 6 for example, direct coupling or using a tapered waveguide will be equally effective. The focusing lens is positioned at a distance from the microlens array to focus the collimated pump beam on to the fiber pig tail. It should be noted that the VCSEL array, the microlens array, the focusing lens and the fiber alignment housing may be maneuvered independently for alignment.

Once all the components are aligned, they are bonded to the module housing baseplate 730. The fiber pigtail is sealed with the alignment guide and the bend radius limiter. The housing cover and baseplate may be environmentally sealed. The baseplate 730 may be bonded to a heat dissipation device for example, a heat sink for cooling the VCSEL array through the thermal mount 723. Cooling may be facilitated by a circulating fluid, for example, air, a gas or a liquid coolant through the heat sink, as has been described in the U.S. patent application Ser. No. 13/541,906 filed on Jul. 5, 2012, that issued as the U.S. Pat. No. 8,675,706 to Seurin et al. on Mar. 18, 2014, and assigned to Assignee of this application.

Figure 8:
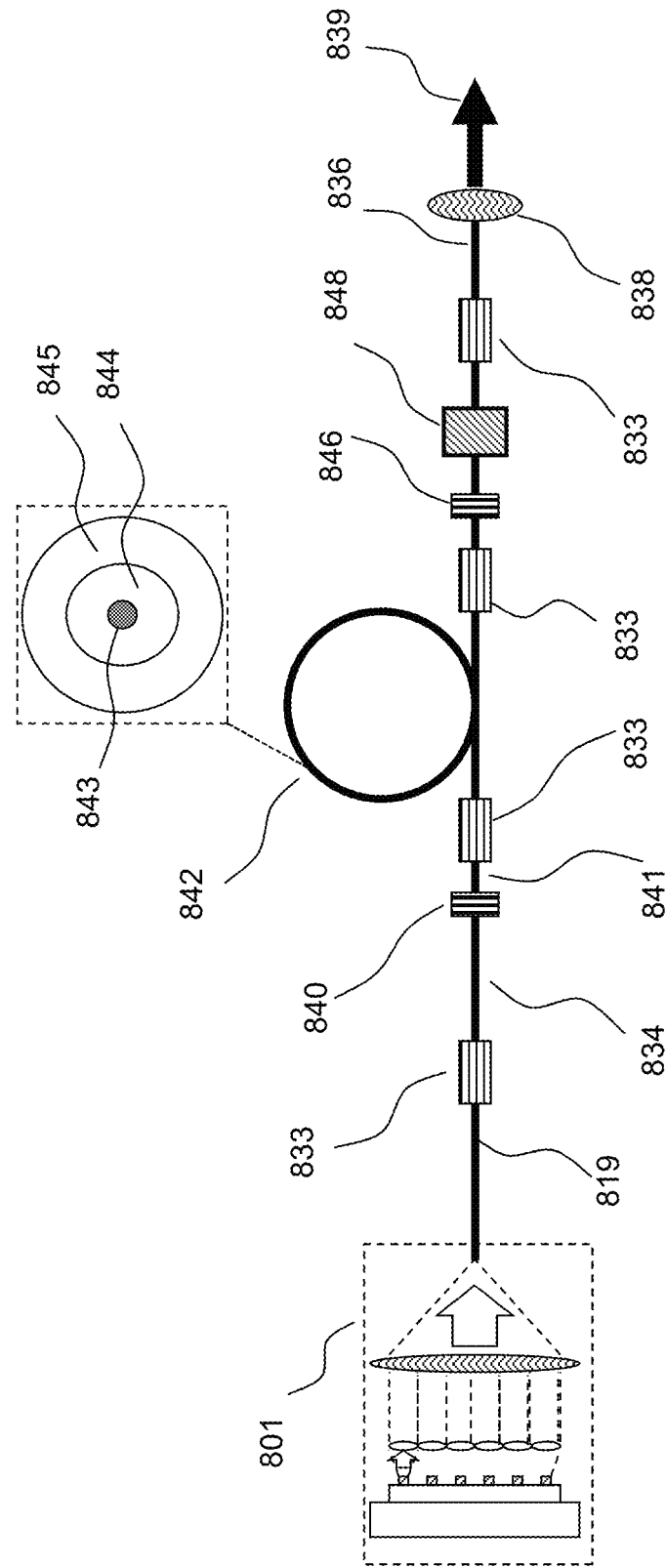
FIG. 8 is a schematic representation of a fiber laser configured using a VCSEL pump module, inset shows a double-clad fiber cross section.

Fiber Laser:

Referring now simultaneously to FIGS. 7 and 1, the VCSEL pump module 701 described in the previous section may be used to configure a fiber gain system 100 described in reference with FIG. 1. More specifically, the optical pump module 701 replaces the block referred as pump module 101 in FIG. 1. In an exemplary embodiment, a fiber laser shown in FIG. 8 is configured according to the concepts outlined in the previous sections. The fiber laser is constructed using a gain element 842 comprising a single or double-clad fiber section for example. The double-clad fiber (shown in the inset) selected for this embodiment includes a core region 843 doped with active ions that generate the lasing action. The core region is surrounded by an inner cladding region 844 and an outer cladding region 845, respectively. It should be noted that other types of gain elements may be pumped equally well using a VCSEL pump module.

The inner cladding region is transparent to the pump radiation. The refractive indices of the core, inner cladding and outer cladding regions are selected such that the pump radiation is confined within the inner and outer cladding regions. The wavelength of the pump radiation is selected to match the absorption band of the ions doped in the core of the gain element fiber for effective absorption of the pump radiation. The pump radiation propagates in the inner cladding region at various angles to the fiber axis so that the pump radiation also propagates across and through the core region. The ions in the core region absorb the pump radiation and transition to an excited state having a higher energy. Upon returning to the ground state, the excess energy manifests as amplified light. The doping ions can be one or more of various types of ions and correspond to the particular operating wavelength desired from the fiber laser.

The gain element is placed between reflectors 840 and 846 to construct a fiber laser resonant cavity. The reflectors are typically fiber Bragg gratings which are effective in the core region but have no effect on the pump radiation in the inner cladding region. In this example the reflector 840 has high reflectivity whereas the second reflector 846 having relatively low reflectivity is configured to be the laser output port. The gain element may be spliced to the reflectors or connected using low loss connectors 833 as shown in FIG. 8. In practice, input and output fiber sections 834 and 836, respectively are spliced to the reflector ends of the gain element to connect it to a pump module or to an output port. Alternatively, low loss connector may also be used.

A fiber pigtail 819 from a pump module 801 is spliced through the gain element via the input fiber 834 at the reflector 840. The output of the fiber laser is emitted through the output fiber section 836 as a diverging beam. An additional lens 838 may be used for obtaining a collimated output beam 839. An optional isolator 848 may be disposed between the output reflector 846 and the output fiber section 836 for preventing reflected light from objects illuminated by the output beam, into the fiber laser which may result in destabilizing the fiber laser, particularly when the internal gain in the gain element is high. An additional option is to coat the fiber end appropriately with antireflection coatings -and/or angle the fiber to reduce reflected light from the fiber end destabilizing the laser.

Figure 9:
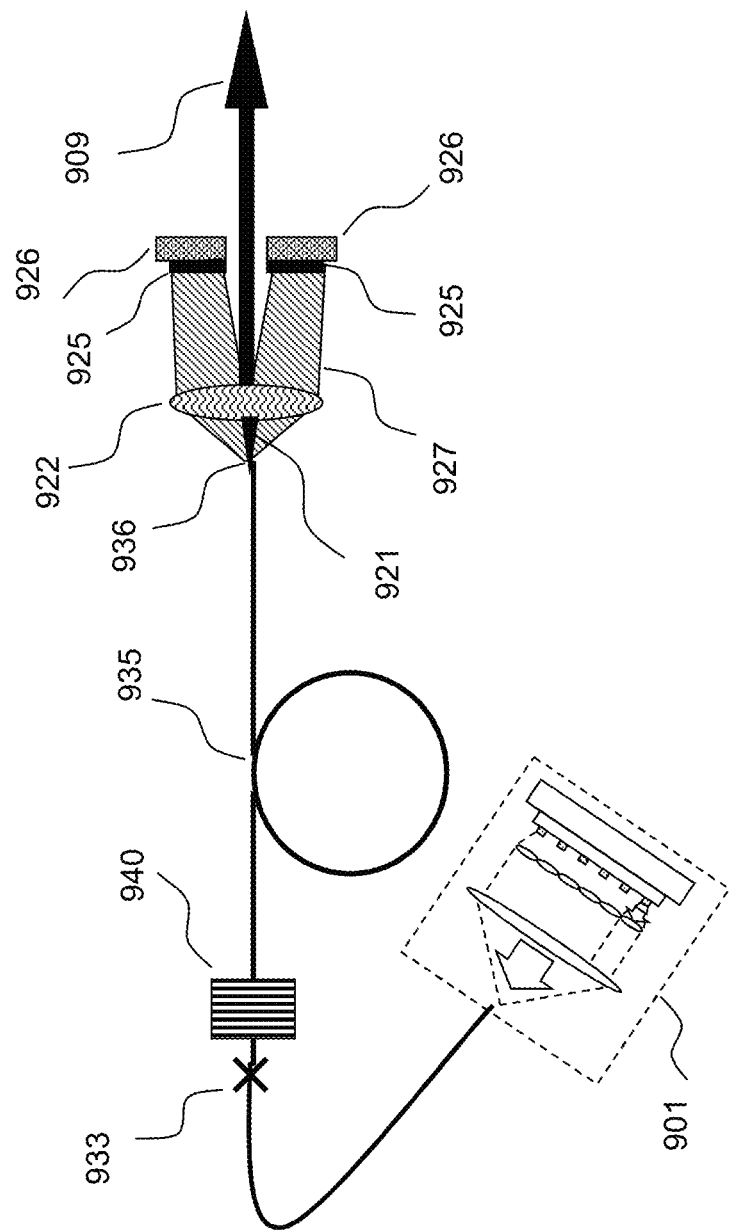
FIG. 9 is a schematic representation of a fiber laser configured in dual pumping mode using VCSEL pump modules.

In one variant embodiment of the invention, particularly when internal gain in the gain element is relatively high, reflectivity of the reflector at the output end (846 in this example) for optimum fiber laser operation needs to be quite low. If the required reflection coefficient required is approximately 4% then instead of a reflector 846 (for example, a fiber Bragg grating) a perpendicular cleaved end of a fiber is preferred. In one embodiment of the invention shown in FIG. 9, a perpendicular cleaved end at the output of the laser is advantageously used for optically pumping the gain element from both ends (dual pumping configuration), particularly when a high pump power is required to obtain high power laser output.

More specifically, a gain element 935 in this example comprises a double-clad fiber similar to the one described in reference with FIG. 8. One end of the gain element is connected or preferably spliced, to a reflector for example, a fiber Bragg grating 940 and the other end 936 is cleaved perpendicular to the lasing axis. A cleaved fiber end functions as a low reflectivity reflector and forms the feedback cavity with the reflector on other end of the gain element. An optical pump module 901 comprising a VCSEL array is connected to the other end of the reflector using a fiber splice or a low loss connector 933 (in this example). VCSEL optical pumping at this end is substantially similar to the one described in reference with FIG. 8 and will not be repeated for brevity.

The perpendicular cleaved end 936 of the fiber also provides laser output 921 which is collimated by one or more optical elements for example, a lens 922 in this case to provide a collimated laser output 909. This arrangement is particularly suited for applying more input pump radiation from the second end of the gain element 935. More specifically, additional pump radiation from one or more VCSEL arrays 925 (only one labeled for clarity) each having a respective microlens array, may be arranged on a thermal mount 926 around the fiber laser output beam. The thermal mount 926 is constructed from a thermally conducting material to provide cooling for the VCSEL arrays. Pump radiation 927 from the VCSEL arrays and microlens assembly is coupled into the inner cladding of the output end 936 (dual pumping) of the fiber laser using the lens 922. A central hole in the aperture mount allows transmission of the output beam 909 from the core of the output fiber 936 through the collimating lens 922.

Referring back to the fiber laser configuration shown in FIG. 8, the fiber laser as described therein may be operated in different modes including Continuous Wave (CW), Quasi-Continuous Wave (QCW) or Pulse (P) modes. In practice, a pump module and in particular a VCSEL array pump module may be operated by applying current continuously for CW operation or by using a pulsed current source at a pre-determined duty cycle for QCW or pulse operation, depending upon the required pulse width at the output of the fiber laser. In one embodiment a pulse generator may be employed to generate an electrical pulse with the pulse length and repetition rate required for the output pulse width for the fiber laser optical output. The output from the pulse generator is amplified to generate a high current drive pulse to drive the VCSEL array pump module. The high energy pumping pulse transmitted through the inner cladding of the pigtail fiber 819 is coupled to the inner cladding region of the gain element and amplifies the fiber laser beam propagating in the core approximately through the duration of the VCSEL pump pulse.

Figure 10:
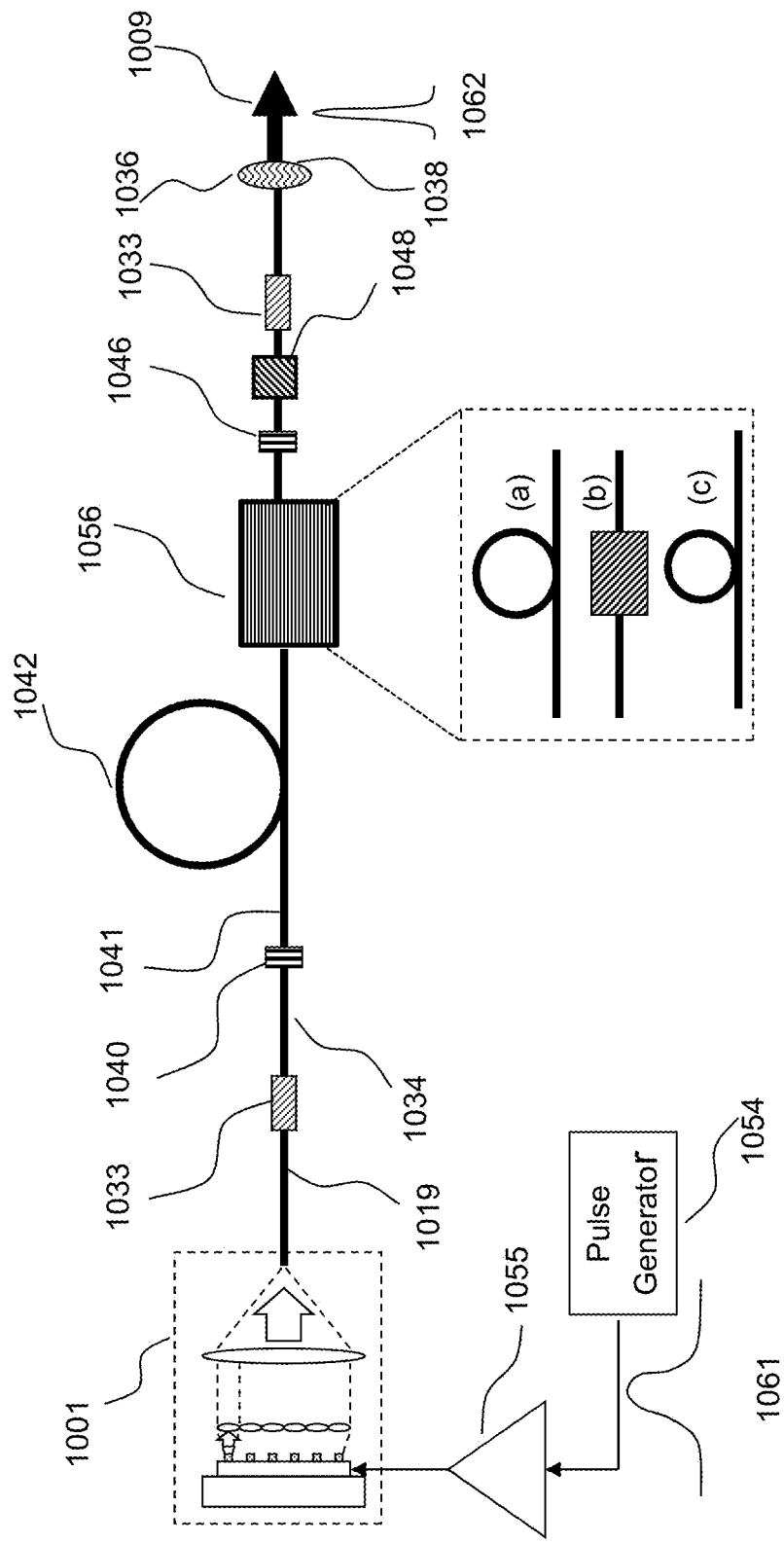
FIG. 10 is a schematic representation of a fiber laser configured in a Q-switch mode for obtaining short laser pulse.

The pulsed fiber laser configuration described above in reference with FIG. 8 is particularly suitable for generating medium length pulses (1-100 microsecond). Generation of shorter pulse in the fiber laser is primarily limited by the dynamics and in particular, the excited state lifetime of the ions that generate the lasing action in the core (843) of the fiber gain element. Therefore, for generating very short laser pulses (1-100 nanosecond), especially in laser systems with gain element with long excited state lifetime well known method of Q-switching is more suitable. FIG. 10 shows an embodiment that may be used to configure a Q-switched fiber laser according to this invention. Principle of Q-switching is well known in the art and will not be elaborated further.

More specifically, the embodiment shown in FIG. 10 comprises a basic fiber laser layout similar to the one described in reference with FIG. 8. Elements that have similar reference numerals are equivalent or provide substantially similar functionality and that description will not be repeated. In this configuration the VCSEL pump module 1001 is operated in pulse mode using a function generator 1054 to generate current driving pulse 1061, the length of which is long enough for significant excitation of the gain fiber 1042. The output pulse 1061 from the function generator is further amplified in a current driver 1055 for driving the VCSEL array(s) of the optical pump module. The pump pulse is transmitted to the inner cladding layer of the pigtail 1019 which is connected to the input fiber section 1034 of the gain element 1042. The gain element is followed by a Q-switch element 1056 which includes but is not limited to, a saturable absorber fiber component, a fiber coupled acousto-optic switch, a SBS (Stimulated Brillouin Scattering) non-linear component and many other devices that are well known in the art for Q-switching and may be selected on their independent merits depending upon the application.

In operation, the ions in the core region of the gain element absorb the pump radiation and acquire a high population density in higher excited states for a period determined by the excited state lifetime. The ions in the excited state have very high internal gain, thereby building a high power pulse very rapidly. When the Q-switch 1056 is activated laser action rapidly builds up and a very short high energy fiber laser pulse 1062 is transmitted to the output end of the fiber through the output reflector 1046, isolator 1048, the output fiber and the collimating lens 1036, respectively. The fiber laser output 1009 in this instance is a succession of high energy short pulses. The repetition rate of this sequence is determined by the rate at which the q-switch is activated. As the high energy pulse is transmitted out of the gain element, the ions in the core region return to the ground state. As a result, the gain build up in the core region terminates rapidly until a new electrical pulse is provided to the VCSEL array to provide optical pumping to the fiber laser.

Figure 11:
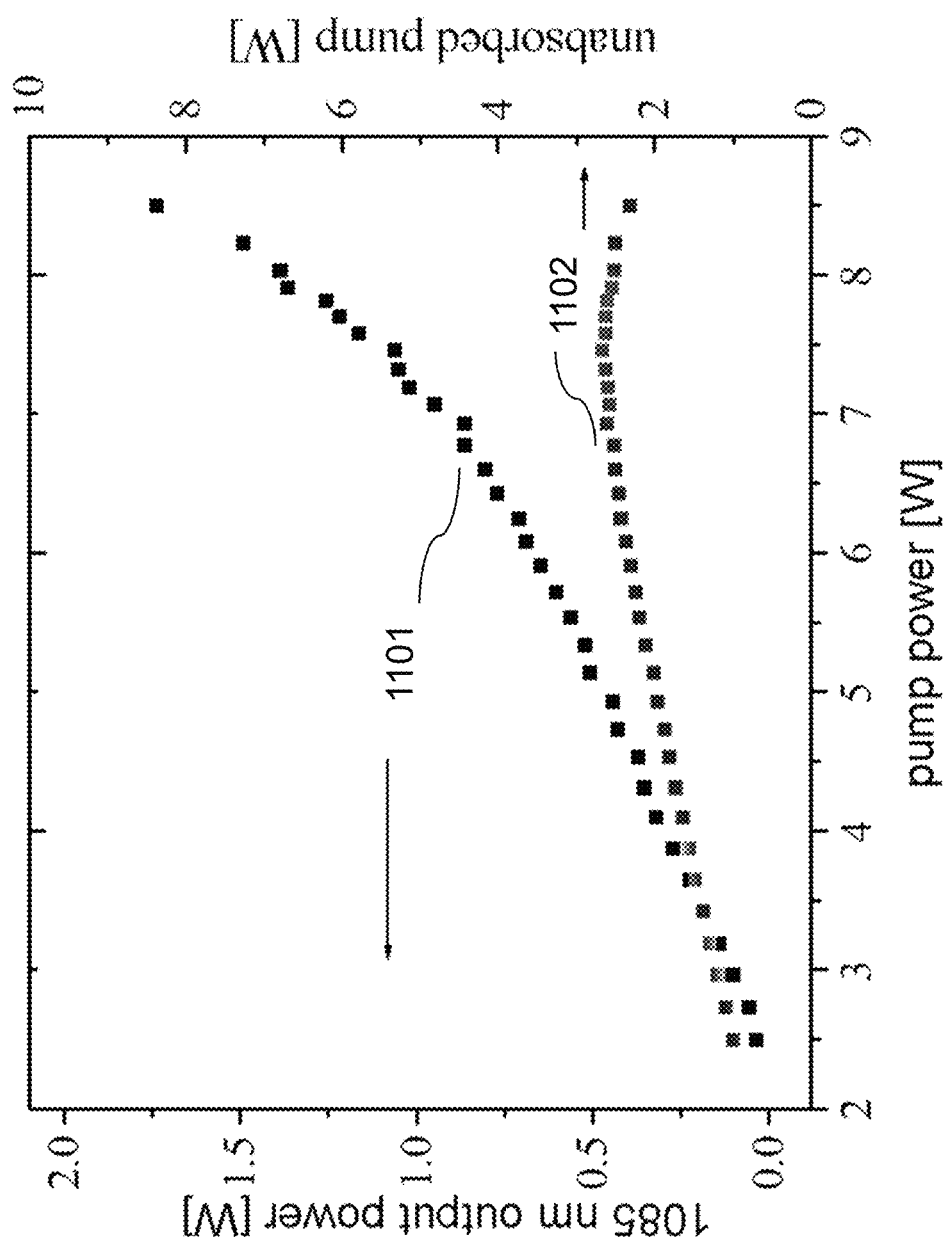
FIG. 11 shows representative performance characteristics of fiber laser configured using VCSEL pump modules.

One advantage of the fiber laser configured according to this invention is that most of the VCSEL array pump power input to the fiber laser gain element is effectively utilized in generating high output power from the fiber laser. The VCSEL pump radiation is emitted in a narrow wavelength band which is significantly narrower than an edge emitter semiconductor laser. By appropriately selecting the VCSEL emission wavelength, it is very well matched to the absorption band of the gain ions so that a high percentage of the pump radiation is absorbed by the gain ions. In FIG. 11, output power from a fiber laser similar to one described in reference with FIG. 8 (or 10), and remaining pump power not absorbed by the fiber laser are plotted as a function of pump power (x-axis) are shown in traces 1101 (left y-axis) and 1102 (right y-axis), respectively. The amount of pump radiation which is not absorbed by the gain fiber is separated from the fiber laser beam by a dichroic reflector or an optical filter.

Figure 12:
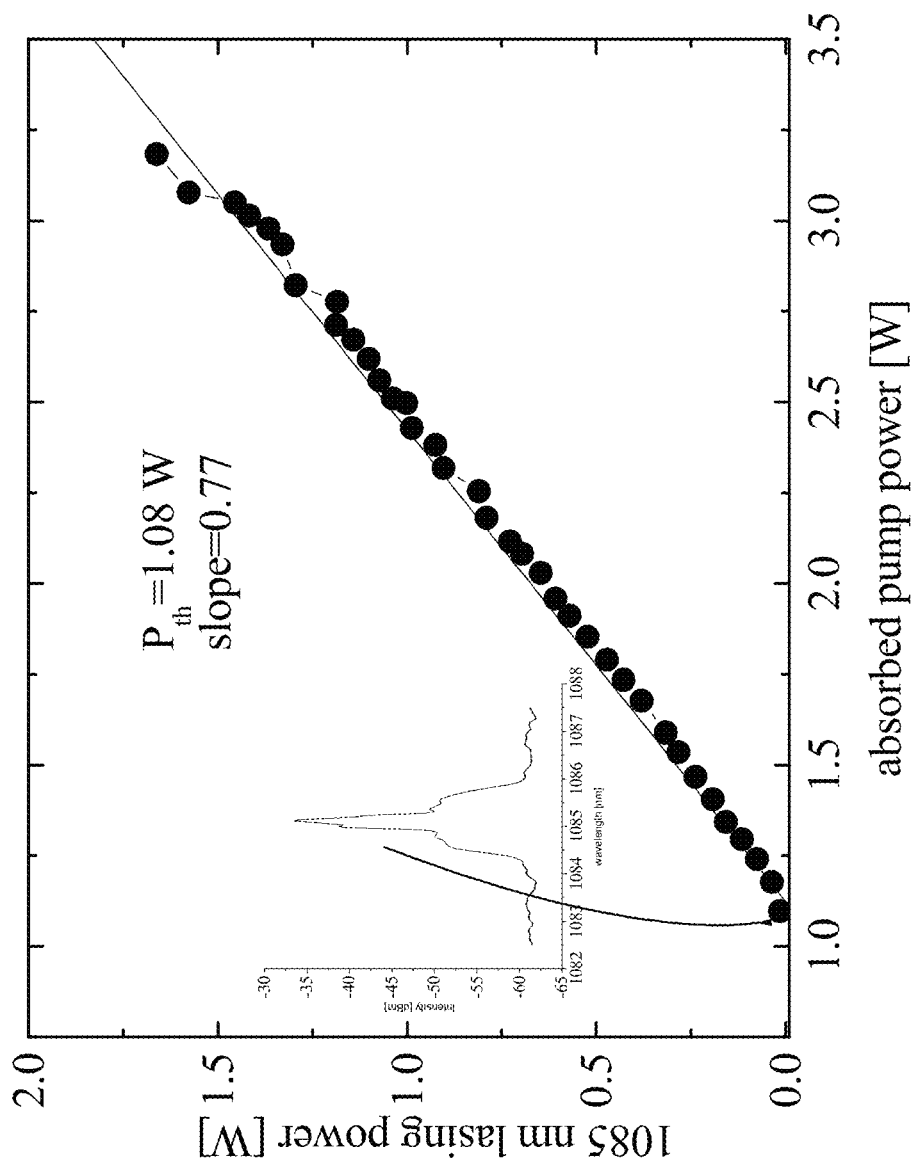
FIG. 12 shows representative performance characteristics of fiber laser configured using VCSEL pump modules.
Figure 13:
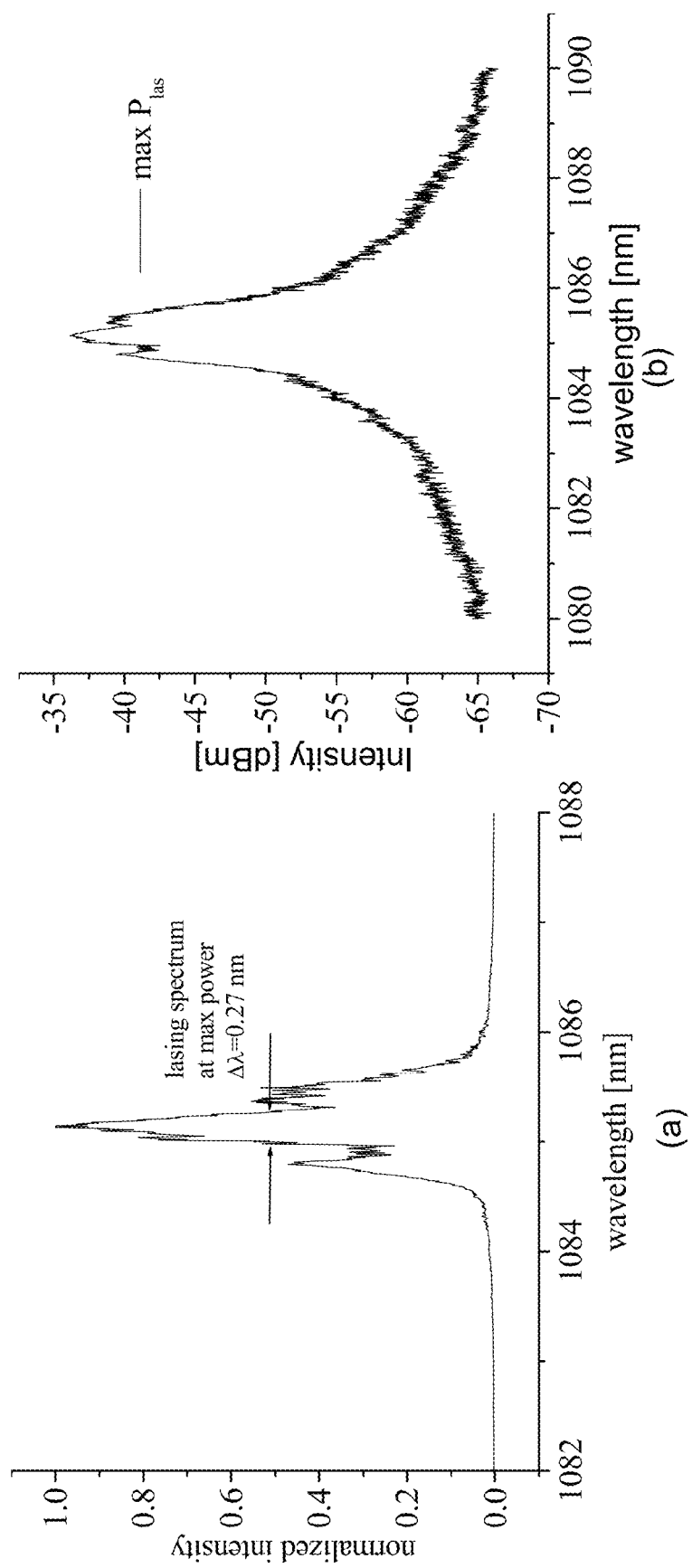
FIG. 13 shows representative performance characteristics of fiber laser configured using VCSEL pump modules.

From the graph shown in FIG. 11, fiber laser output power as a function of absorbed pump power is plotted as shown in FIG. 12. The graph shown in this plot indicates that the fiber laser output power is linear with the absorbed pump power. The inset shows the optical spectrum of the fiber laser output radiation. A detail output spectrum of the fiber laser output is shown in FIG. 13 in linear scale (a) and logarithmic scales (b), respectively. More specifically, FIG. 12*a* shows a normalized plot of the output spectrum whereas, FIG. 12*b* shows the intensity plotted (y-axis) in dBm as a function of wavelength. The spectral linewidth is about 0.27 nm for this exemplary fiber laser.

Figure 14:
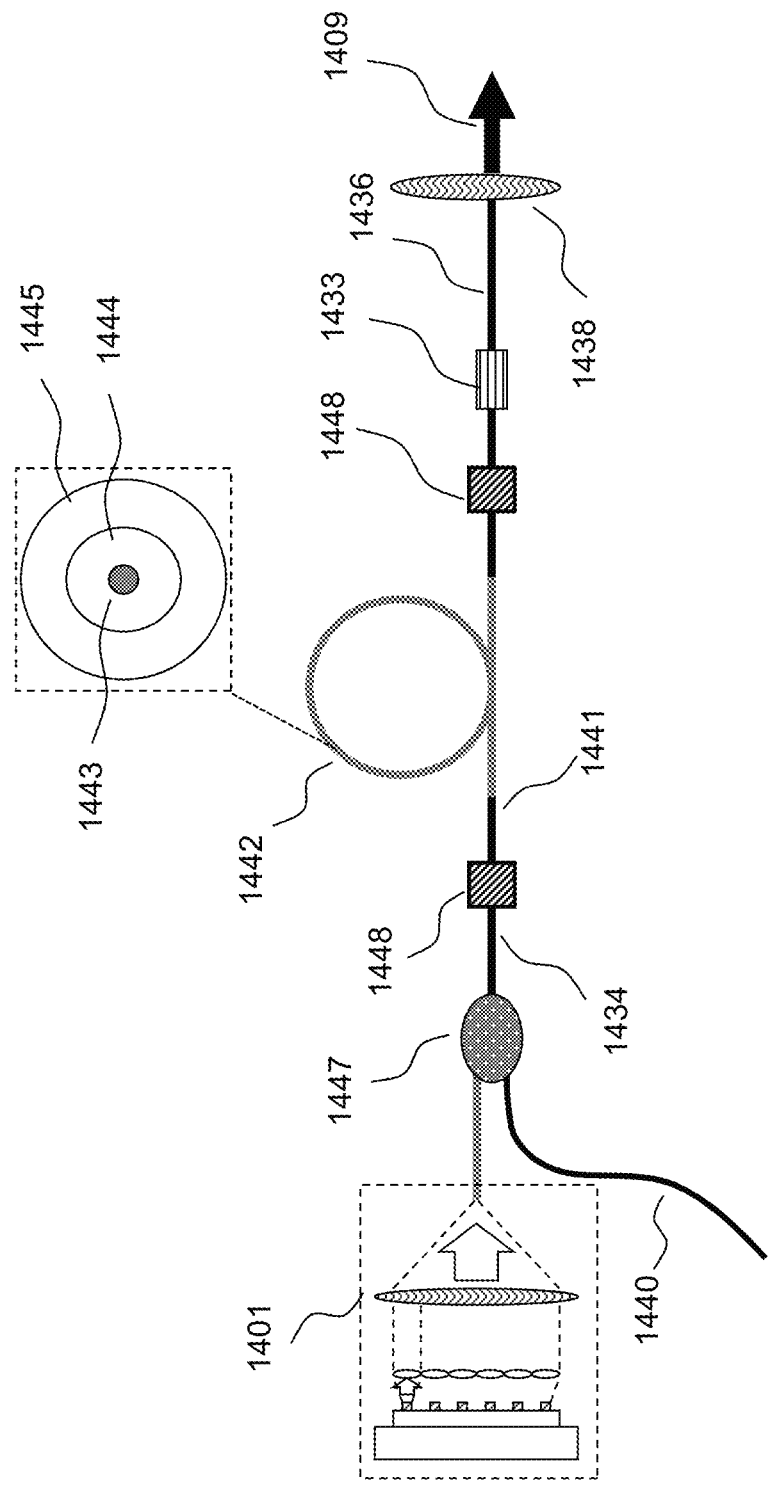
FIG. 14 is a schematic representation of a fiber amplifier configured using VCSEL pump module.

Fiber Amplifier:

Referring back to FIG. 1, a fiber gain system shown therein may be configured as a fiber amplifier. One embodiment of a fiber amplifier configured using VCSEL array optical pump module is shown in FIG. 14. A fiber amplifier has many components that are similar to the fiber laser described in reference with FIG. 8. More specifically, a fiber amplifier comprises a gain element 1442 including a core region, an inner cladding region and an outer cladding region 1443, 1444 and 1445, respectively (shown in the inset) that have substantially the same functionality described earlier in reference with FIG. 8. The core region includes active ions that generates optical gain and contributes to the amplification of an optical signal. While the principles are being described using this particular configuration, same principle may be extended to configure other types of fiber amplifier.

Pump radiation is generated in a pump module 1401 that comprise a VCSEL array to couple light to the inner cladding of an input port whereas the optical signal 1440 to be amplified is connected to the core of the input port of an optical combiner 1447. The output port of the combiner comprises a double-clad fiber 1434 that matches the cross-section of the fiber gain element input section 1441. In effect, the input signal propagates in the core region and the pump radiation propagates in the inner cladding and core regions of the combiner and fiber gain elements. An optical isolator 1448 is placed between the fiber gain element 1442 and the input fiber section 1441 to control the light only in the core. More specifically, the isolator facilitates transmission of the input signal to be amplified into the fiber gain element input in the forward direction but prevents reflection of radiation from the gain element traveling in the backwards direction going back into the fiber amplifier gain element to prevent destabilization of the fiber amplifier.

Amplified signal is transmitted out of the gain element through a second isolator 1448 placed on the right side of the gain element in this example. The isolator prevents any reflected signal from being transmitted back into the gain fiber and destabilizing the fiber amplifier. The second isolator is connected to an output fiber section 1436 preferably by fusion splicing, or via a low loss coupler 1433. Typically, the output from the amplifier is a diverging beam which is collimated using additional optical elements for example, a simple lens 1438 in this exemplary case, into an amplified output signal 1409. Other ways of beam shaping may also be used depending upon the application and these methods are well known in the art.

Furthermore, to achieve higher gain and output power from the fiber amplifier, multiple stages of amplifiers may be constructed by cascading, namely the output 1409 in output fiber

1436 from one stage is connected to an input coupler similar to 1447 together with a second optical pump module similar to 1401 to construct a second stage amplifier. It may further be recognized that each stage of amplification in a multi-stage configuration may be substantially similar or may differ depending upon the level of amplification required at each stage. For example, each successive amplifier stage may be designed to handle a different level of input and output optical power. It is also important to ascertain that the physical dimension of the double-clad fiber gain element is matched well with the double-clad fiber used for input and output port pigtails.

In a further variation, an output from a fiber laser similar to the one described in reference with FIG. 8 may be appropriately combined with a fiber amplifier stage similar to the one described in reference with FIG. 14 to configure a CW or pulse mode fiber laser with high output power. In this configuration, a first stage of a gain element is configured as a laser to be operated in CW, QCW or pulse mode. Non-collimated output from the first stage is appropriately combined to a second stage of gain element configured as a fiber amplifier. These and other combinations and sub-combinations that may occur to those practicing the art are included within the broad framework of the description provided here.

It may be appreciated by those skilled in the art that the input signal 1440 to be amplified may be any type of CW, QCW, pulse including very short pulse, or multiplexed signal such as a wavelength division multiplexed (WDM) signal. Advantageously, a fiber amplifier configured as described may provide amplification for optical signal having specialized characteristic for example, very short pulses, very low noise CW optical signals, very narrow linewidth signals and FM modulated signals for Doppler LIDAR applications, just to name a few. The fiber amplifier using pump modules including VCSEL arrays provide an ideal solution for amplifying these types of optical signals where preserving high quality and special characteristics of the signal is important.

Figure 15:
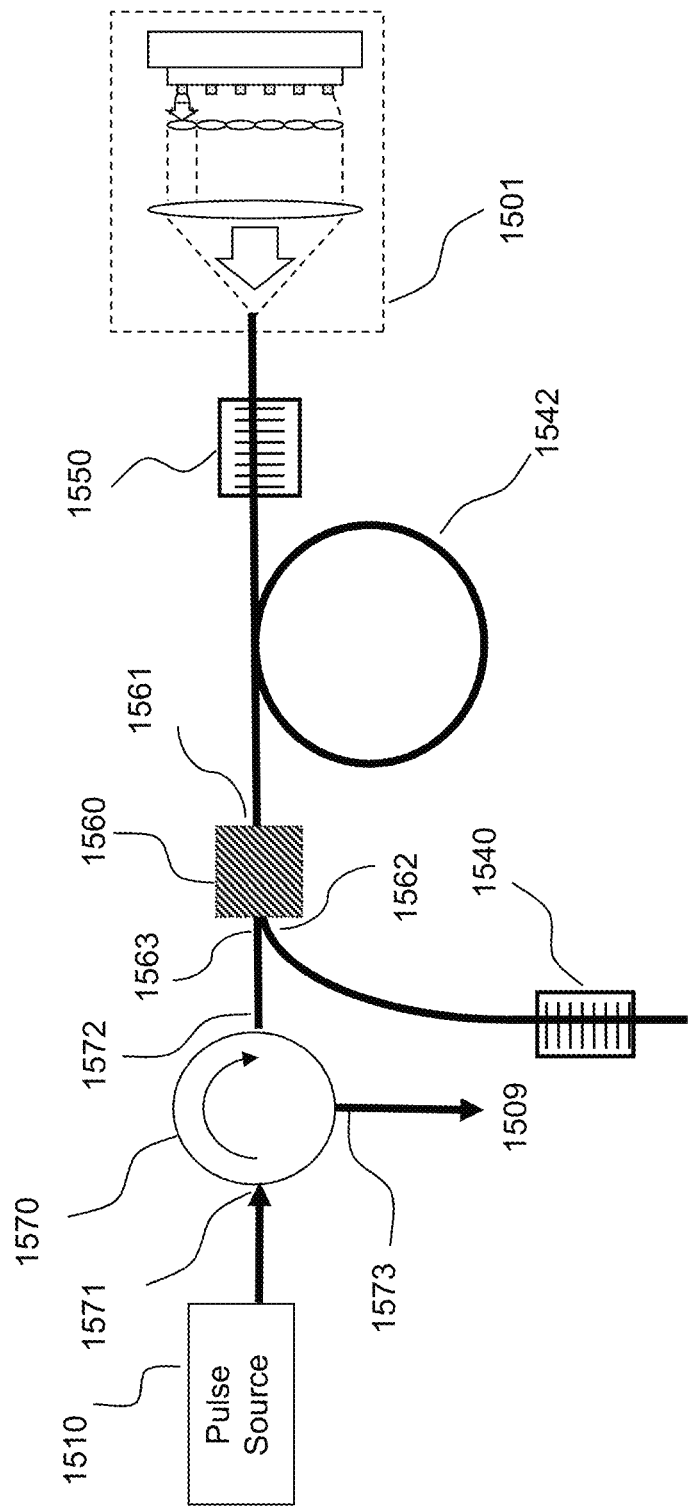
FIG. 15 is a schematic representation of a laser amplifier configured to operate in a regenerative mode.

Regenerative Fiber Laser:

In one embodiment shown in FIG. 15, a VCSEL pumped regenerative fiber laser is provided by combining a fiber laser stage with a fiber amplifier stage. The configuration also known as Master Oscillator Pulse Amplifier (MOPA) is particularly useful in preserving pulse quality of a short laser pulse while amplifying the pulse to provide very high output power, for example. In particular, a fiber gain element 1542 including a core, an inner cladding and an outer cladding region, is set up in regenerative loop configuration. The regenerative loop includes an acousto-optic switch 1560 placed with the gain element between two reflectors 1540 and 1550, respectively, to provide a feedback resonator. The reflectors may include but is not limited to fiber Bragg gratings as shown in this exemplary embodiment. The acousto-optic switch shown in this example has three ports 1561, 1562 and 1563, respectively. In a closed position of the acousto-optic switch light entering the core region of the fiber gain element traverses between ports 1561 and 1562 to the high reflectivity fiber Bragg grating. In an open position of the acousto-optic switch, light entering at port 1561 is transmitted to port 1563 and port 1562 is blocked.

A pump module 1501 comprising VCSEL arrays is connected to one of the reflectors 1550 to pump the gain element 1542. For this application the pump module is operated in pulse mode. The pump radiation is coupled to the inner cladding region of the fiber gain element through the inner cladding region of the fiber Bragg grating 1560. The pump radiation pulse is relatively long so that a large proportion of the ions in the core of the fiber gain element absorb the pump radiation and transition to the excited state for a period of time governed by the upper excited state lifetime.

A pulse source 1510 generates pulses to be amplified which for the purpose of discussion will be referred as a 'seed' laser pulse. The seed laser pulses may be generated by another laser or other types of optical sources producing short pulses with the required wavelength and pulse length characteristics. The seed laser pulses enter the regenerative loop via a circulator 1570 at an input port (or input fiber) 1571 and couples to the acousto-optic switch at a port 1563 through a second port 1572 of the circulator.

In operation, at a specified time synchronized with the VCSEL pump module pulse, when the acousto-optic switch is in 'open' position, a seed laser pulse from the pulse source is transmitted to the core of the fiber gain element via port 1561. Immediately after the seed laser pulse passes through the switch the acousto-optic switch is closed. The seed laser pulse transmits through the core of the fiber gain element and is amplified by the excited ions in the core region of the gain element. The amplified seed laser pulse is reflected by the fiber Bragg grating 1550 back into the core region of the fiber gain element and amplified further. The amplified seed laser pulse is transmitted by the now closed acousto-optic switch from port 1561 to port 1562 and to the other fiber Bragg grating reflector 1540.

As a consequence, in each pass the seed pulse is thus reflected back and forth through the fiber gain element and is amplified continuously. At a suitable time when the seed laser pulse has depleted the fiber gain element and reached its maximum energy, the acousto-optic switch is opened at the point such that the amplified high energy seed laser pulse may be transmitted from port 1561 to port 1563 into the core of fiber connecting the second circulator port 1572 to the acousto-optic switch port 1563 which enables the amplified seed laser pulse to exit from the circulator port 1573 as the output pulse 1509.

One advantage of the fiber gain systems designed according to this invention is that the VCSEL pump power may be increased further by passively coupling pump radiation from several pump modules using star couplers for example, as is well known in the art. However, a star coupler configured according to this invention requires double-clad fiber for matching the fiber employed in the gain element of a fiber laser or amplifier. Additional pump modules may be employed in a modular fashion. In general, for efficient coupling of radiation from one fiber to the other, while connecting double-cladding fibers either by fusion splicing or by low loss connector, it is important that the physical dimension of the core and cladding regions, particularly the inner cladding region is well matched. The star couples may be placed before or after the reflectors or isolators as the case may be.

Figure 16:
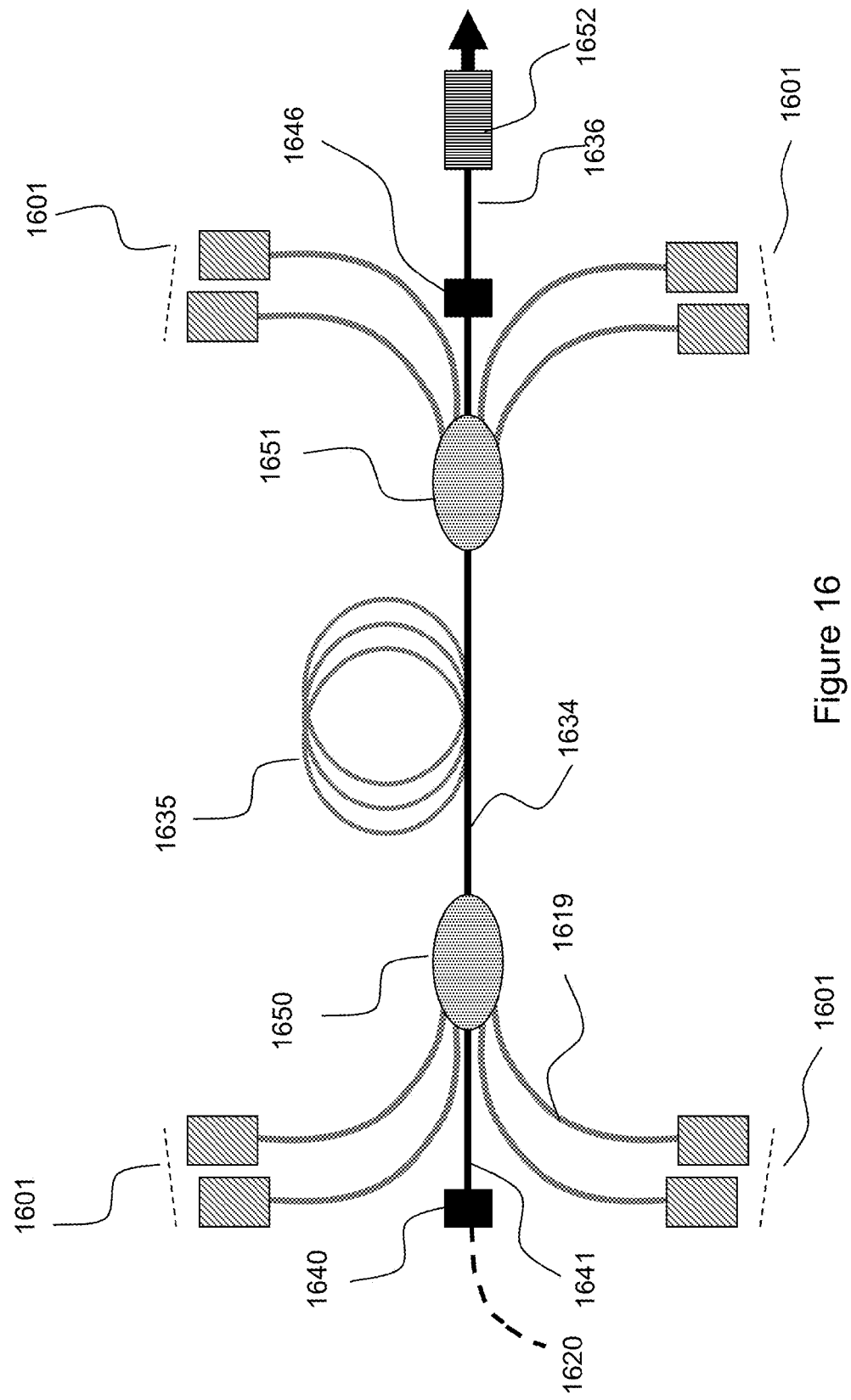
FIG. 16 is a schematic representation of a fiber laser or an amplifier configured with multiple VCSEL pump modules coupled into a single fiber gain element.

As shown in FIG. 16, one embodiment of exemplary star couplers comprising double-clad fiber is provided. This configuration may be used to generate higher pump power for fiber laser or for an amplifier (with some slight modification) and is particularly suitable for pump modules comprising VCSEL emitter arrays. Due the small form factor of VCSEL array modules, high pump power modules may be configured in a relatively small physical area. The basic design principle for high power start coupler using double-clad fiber is similar for both the applications. High power star couplers may be configured in single end pumping as well as dual end pumping configuration. In particular, pump beam from several pump modules 1601 are combined in an optical coupler 1650 placed at the input end of the gain element 1635. The fiber combiner is designed to couple pump beams from respective inner cladding of each input fiber 1619 (only one labeled) into the inner cladding of the output fiber 1634 of the coupler.

In case of a fiber laser configuration shown in FIG. 16, the coupler may be placed before the reflector 1640 and connected to the coupler at a designated port such that only the laser signal propagates through the core region of that port. The output of the coupler is designed to have substantially similar dimensions as the gain element double-clad fiber. The combined pump beam form multiple VCSEL pump modules is transmitted directly to the inner cladding of the gain fiber, whereas the laser emission is confined in the core region of the gain element. In an alternative arrangement, the fiber reflector may be placed after the coupler and the output port of the fiber reflector is matched with the gain element. Furthermore, in a configuration where the fiber laser is pumped only from one end, the other end of the gain element is directly connected to the second reflector 1646.

However, for higher output power, the laser may be optically pumped from the other end of the gain element also shown in FIG. 16. A second coupler 1651 substantially similar to the coupler 1650 is connected between the gain element and the second reflector. One or more optical pump modules are connected to this end of the gain element as well. The coupler is designed to have a fiber dedicated to connect the reflector and the output fiber 1636 from the reflector propagates the laser output. In both arrangements, one of the combiner 1651 input fibers has a core region which is directly connected to the core of the coupler output fiber 1636. A fiber collimator 1652 including a fiber and lens may optionally be used to collimate the diverging beam into a free space parallel beam by a lens.

The arrangement shown in FIG. 16 with a little modification is also applicable for adding VCSEL pump modules for fiber amplifier application. In this embodiment, the fiber reflectors 1640 and 1646 are replaced by isolators. Similar to the fiber laser configuration, the isolators may be placed before or after the couplers 1650 and 1651 and the coupler ports may accordingly be designed to match the gain element appropriately. Those skilled in the art may appreciate that the pump power may be increased in a modular fashion with relative ease and additional cost as compared to conventional optical pumps, even those including single VCSEL devices or linear arrays of VCSEL devices.

Although the invention has been described with particular reference to preferred embodiments of VCSEL and VCSEL array pump modules to configure fiber gain systems for different applications, these specific examples are merely to illustrate systems where the high power pump modules according to this invention may be used. Pump modules described in this invention may be used in other fiber gain systems. Pump modules described here show regular two dimensional VCSEL arrays of a specified shape. However, single high power VCSELs, linear arrays or two dimensional arrays including arrays of different shapes, or arrays of one or two dimensional arrays of VCSELs may be used to configure pump modules emitting in different shapes depending on the requirements of the particular fiber laser pumping application. Variations and modifications of these combinations, and sub-combinations that will be apparent to those skilled in the art are included within the broad framework of the invention that is captured in the appended claims.

What is claimed is:

1. A regenerative fiber optic amplifier system comprising:
    a fiber optic pump module including a plurality of VCSEL emitters and an optical fiber to output a pump beam generated in said optical pump module;
    a first reflector having a reflectivity significantly higher than the reflectivity of a second reflector;
    a fiber gain element having a core doped with a plurality of optically active ions, wherein a first end of the fiber gain element is connected to the optical fiber via the first reflector so as to couple the pump beam to the fiber gain element;
    an acousto-optic switch including at least three ports, wherein one port of the acousto-optic switch is connected to a second end of the fiber gain element, and a second port of the acousto-optic switch is connected to the second reflector, so as to form a regenerative resonant cavity between the first and second reflectors enclosing the fiber gain element via the acousto-optic switch;
    a circulator having at least three ports that are independent of each other, wherein a first output port of the circulator is connected to the second port of the acousto-optic switch;
    an optical signal source connected to an input port of the circulator to transmit a signal pulse to the regenerative resonant cavity through the first output port of the circulator and the acousto-optic switch, wherein upon closing the acousto-optic switch in synchronization with pulse operation of the pump module, the pump beam recirculates until the signal in the regenerative resonant cavity amplifies to a saturation limit, and subsequently upon opening the acousto-optic switch, an amplified signal pulse is transmitted from the gain element to a third port of the circulator via the acousto-optic switch.

2. The fiber optic amplifier system as in claim 1, wherein the optical pump module further includes:
    a thermal mount, wherein the plurality of VCSEL emitters are disposed in thermal contact with the thermal mount;
    one or more optical components, said optical components disposed at a predetermined distance following said plurality of VCSEL emitters to collimate and combine respective optical beams emitted from the plurality of VCSEL emitters to have a substantially uniform intensity in the pump beam;
    an optical coupling device disposed at a pre-determined distance following the one or more optical components;
    an optical alignment housing positioned at a pre-determined distance following said optical coupling device to support and coaxially align an input end of the optical fiber with the optical coupling device and the pump beam for coupling a maximum intensity of the pump beam to the input end of the optical fiber to provide the output pump beam at an output end of the optical fiber.

3. The fiber optic amplifier system as in claim 2, wherein one or more optical components is one selected from a group consisting of lens, one or more microlenses substantially aligned with a corresponding one or more of the plurality of VCSEL emitters, and a combination thereof.

4. The fiber optic amplifier system as in claim 2, wherein the optical coupling device includes a lens or a taper optical component.

5. The fiber optic amplifier system as in claim 2 further including:
    an external housing, said housing having a thermally conducting base plate in thermal contact with the plurality of VCSEL emitters, and wherein the plurality of VCSEL emitters, the one or more optical components, the optical coupling device, and the fiber alignment housing are secured coaxially on the base plate; and
    an external elevated cover, said cover to enclose the fiber optic pump module on the base plate, wherein said cover further includes a fiber alignment guide and a bend radius limiter on one end to support and secure the optical fiber coming out of the external housing, and wherein said external housing is adaptable for an external cooling device placed in thermal contact with the base plate using a circulating fluid that is one selected from the group consisting of a gas, a liquid and a combination thereof.

6. The fiber optic amplifier system as in claim 1, wherein the plurality of VCSEL emitters in the optical pump module are one selected from the group consisting of a two reflector VCSEL, a three reflector VCSEL and a combination thereof, and wherein the plurality of VCSEL emitters are arranged in linear or two dimensional planar arrays configured to emit collectively.

7. The fiber optic amplifier system as in claim 1, wherein the optical fiber is a double-clad fiber and the pump beam is coupled to the core, an inner cladding, or a combination thereof.

8. The fiber optic pump module as in claim 1, wherein the optical fiber is a single-clad fiber, wherein the pump beam from the plurality of VCSEL emitters is coupled to the core of the fiber.

9. The fiber optic amplifier system as in claim 1, wherein the fiber gain element comprises a single-clad fiber and the pump beam is coupled to the core of the gain element fiber.

10. The fiber optic amplifier system as in claim 1, wherein the fiber gain element comprises a double-clad fiber and the pump beam is coupled to the gain element fiber in the core, an inner cladding, or a combination thereof.

11. The fiber optic amplifier system as in claim 1 further including one or more isolators, wherein at least one isolator precedes, and at least one isolator follows the fiber gain element.

12. The fiber amplifier as in claim 11, wherein the one or more isolators are constructed using a double-clad fiber having a core and an inner cladding matched respectively, to the core and inner cladding of the fiber gain element.

13. The fiber optic amplifier system as in claim 1, wherein the first and the second reflectors are fiber Bragg gratings having respectively, a high reflectivity core and a low reflectivity core.

14. The fiber optic amplifier system as in claim 13, wherein the first and second reflectors are constructed in the core region of a double-clad fiber.

15. The fiber optic amplifier system as in claim 1 further including additional one or more optical pump module, wherein the additional one or more pump module are constructed using a plurality of VCSEL emitters that are arranged in a linear or two-dimensional array.

16. The fiber optic amplifier system as in claim 15, wherein a plurality of pump beams generated from the pump module and the additional one or more pump module are arranged around the input end of the first reflector to combine the plurality of pump beams using a single optical component.

17. The fiber optic amplifier system as in claim 15, wherein a plurality of pump beams generated from the pump module and the additional one or more pump module is combined in a double-clad fiber combiner, said combiner having one output fiber and multiple input fibers, wherein at least one input fiber of said combiner has a core connected to the core of said output fiber, so as to combine the plurality of pump beams propagating in the inner cladding of each input fiber to the inner cladding and core of the output fiber to facilitate coupling the plurality of pump beams to the first reflector.

* * * * *